United States Patent
Koga et al.

(10) Patent No.: US 10,224,898 B2
(45) Date of Patent: Mar. 5, 2019

(54) PIEZOELECTRIC WAFER, PIEZOELECTRIC VIBRATION PIECE, AND PIEZOELECTRIC VIBRATOR

(71) Applicant: DAISHINKU CORPORATION, Kakogawa-shi, Hyogo (JP)

(72) Inventors: Tadataka Koga, Kakogawa (JP); Tomo Fujii, Kakogawa (JP); Kozo Shibutani, Kakogawa (JP); Satoru Ishino, Kakogawa (JP); Yoshinari Morimoto, Kakogawa (JP); Kazuki Otani, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 454 days.

(21) Appl. No.: 15/036,752

(22) PCT Filed: Sep. 17, 2014

(86) PCT No.: PCT/JP2014/004784
§ 371 (c)(1),
(2) Date: May 13, 2016

(87) PCT Pub. No.: WO2015/072057
PCT Pub. Date: May 21, 2015

(65) Prior Publication Data
US 2016/0294353 A1    Oct. 6, 2016

(30) Foreign Application Priority Data

Nov. 13, 2013  (JP) ................................ 2013-235325
Nov. 22, 2013  (JP) ................................ 2013-242351
(Continued)

(51) Int. Cl.
*H03H 9/21*     (2006.01)
*H01L 41/22*    (2013.01)
(Continued)

(52) U.S. Cl.
CPC ....... *H03H 9/0595* (2013.01); *H01L 41/0475* (2013.01); *H01L 41/053* (2013.01);
(Continued)

(58) Field of Classification Search
CPC .... H03H 9/0595; H03H 3/02; H03H 9/02393; H03H 9/10; H03H 9/21; H03H 9/215; H01L 41/0475; H01L 41/053; H01L 41/33
(Continued)

(56) References Cited

U.S. PATENT DOCUMENTS

2011/0043079 A1    2/2011  Shirari et al.
2012/0056513 A1    3/2012  Ueno

FOREIGN PATENT DOCUMENTS

JP    2003-198303         7/2003
JP    2005-318080 A   *  11/2005  ............... H03H 2/00
(Continued)

*Primary Examiner* — Thomas Dougherty
(74) *Attorney, Agent, or Firm* — Norris McLaughlin, P.A.

(57) ABSTRACT

This piezoelectric wafer has: a piezoelectric vibration piece; a frame portion that supports the piezoelectric vibration piece; and a coupling portion that couples the piezoelectric vibration piece to the frame portion. A pair of first and second metal bumps is formed in juxtaposition on the piezoelectric vibration piece. The coupling portion has slits extending in its width direction except in a bridge, i.e., a part of the coupling portion in its width direction. An end in the width direction of the bridge is distantly spaced from the first and second metal bumps both in a direction perpendicular to the width direction of the coupling portion with no overlap with these metal bumps.

22 Claims, 30 Drawing Sheets

(30) Foreign Application Priority Data

Nov. 22, 2013 (JP) ................. 2013-242352
Nov. 22, 2013 (JP) ................. 2013-242353

(51) Int. Cl.
| | |
|---|---|
| *H03H 9/05* | (2006.01) |
| *H03H 9/215* | (2006.01) |
| *H01L 41/047* | (2006.01) |
| *H01L 41/053* | (2006.01) |
| *H01L 41/33* | (2013.01) |
| *H03H 9/02* | (2006.01) |
| *H03H 9/10* | (2006.01) |
| *H03H 3/02* | (2006.01) |

(52) U.S. Cl.
CPC ............ *H01L 41/33* (2013.01); *H03H 3/02* (2013.01); *H03H 9/02393* (2013.01); *H03H 9/10* (2013.01); *H03H 9/21* (2013.01); *H03H 9/215* (2013.01); *H03H 2003/026* (2013.01)

(58) Field of Classification Search
USPC .................................. 310/311–371
See application file for complete search history.

(56) References Cited

FOREIGN PATENT DOCUMENTS

| | | | | |
|---|---|---|---|---|
| JP | 2007-096899 | | 4/2007 | |
| JP | 2010-062789 | | 3/2010 | |
| JP | 2010-87842 A | * | 4/2010 | ............ H03H 2/00 |
| JP | 2010-178064 | | 8/2010 | |
| JP | 2011-160016 | | 8/2011 | |
| JP | 2012-023528 | | 2/2012 | |
| JP | 2012-054893 | | 3/2012 | |
| JP | 2013-207509 | | 10/2013 | |
| WO | 2010/035714 | | 4/2010 | |

\* cited by examiner

F I G. 1 8 a
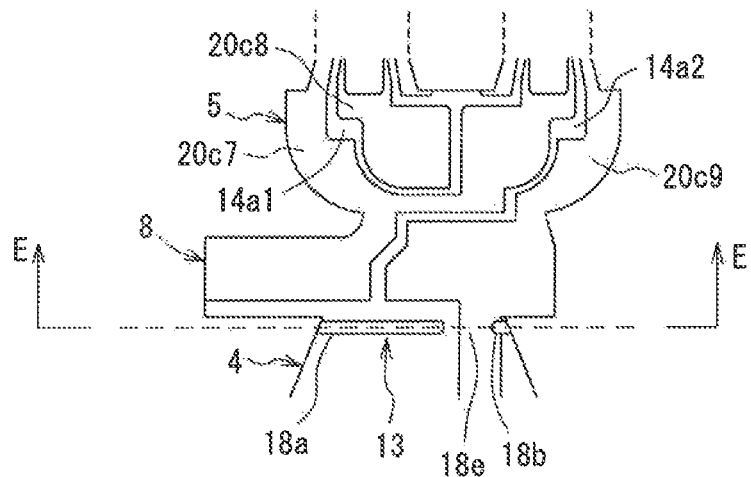
F I G. 1 8 b
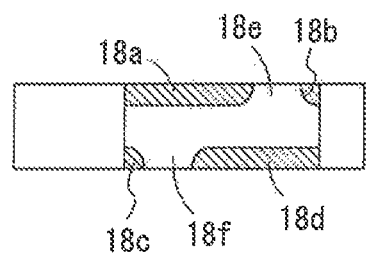
F I G. 1 8 c
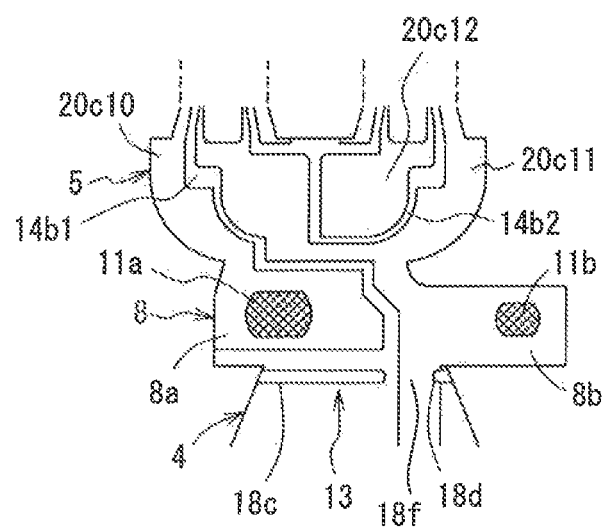

PIEZOELECTRIC WAFER, PIEZOELECTRIC VIBRATION PIECE, AND PIEZOELECTRIC VIBRATOR

BACKGROUND OF THE INVENTION

The invention relates to a piezoelectric wafer including piezoelectric vibration pieces such as crystal vibration pieces, piezoelectric vibration pieces to be broken off and separated from the piezoelectric wafer into individual pieces, and a piezoelectric vibrator in which a piezoelectric vibration piece is supportably mounted in a package.

As for the production of piezoelectric vibration pieces, typically, multiple pieces are obtained at once from one piezoelectric wafer.

In order to obtain multiple piezoelectric vibration pieces from one piezoelectric wafer, piezoelectric wafers may be conventionally fabricated by wet-etching a resist pattern formed by photolithography. As a result, a piezoelectric wafer may be obtainable that has a large number of piezoelectric vibration pieces, frame portions supporting the piezoelectric vibration pieces, and coupling portions coupling the piezoelectric vibration pieces to the frame portions, wherein the piezoelectric vibration are broken off at the coupling portions and separated into individual pieces (refer to JP 2013-207509A).

Some of the known piezoelectric wafers may have slits formed in the coupling portions in its width direction, which may be helpful in breaking off the piezoelectric vibration pieces. An example of such piezoelectric wafers having the break-off assisting slits is described referring to FIG. 1. A piezoelectric wafer $1a$ has piezoelectric vibration pieces $2a$ with metal bumps $11a$ and $11b$ formed thereon, frame portions 3 supporting the piezoelectric vibration pieces $2a$, and coupling portions 4 coupling the piezoelectric vibration pieces $2a$ to the frame portions 3. The coupling portions 4 each have slits $13g1$ to $13g3$. These slits are formed so as to penetrate through front and back surfaces of the coupling portion 4 in its width direction to make the piezoelectric vibration pieces more easily breakable. The coupling portion 4 further has slit-less bridges $13g4$ and $13g5$ formed in a part thereof in the width direction among the slits $13g1$ to $13g3$.

SUMMARY OF THE INVENTION

A test performed on the piezoelectric vibration pieces broken off from the piezoelectric wafer, however, brought an unpleasant fact to light. Specifically, the test, which applied an external force, such as an impact load, to the piezoelectric vibration pieces, revealed the occurrence of vibration frequency drift in some of the piezoelectric vibration pieces. In the wake of this test result, the inventors studied the phenomenon to find out its causation.

Their study suggested that cracks originating from the bridges $13g4$ and $13g5$ were possibly generated when the piezoelectric vibration piece $2a$ was broken off at the frame portion 3, spreading as far as a break-off end part and/or its vicinity of the piezoelectric vibration piece $2a$.

When such a piezoelectric vibration piece with cracks spreading as far as its break-off end part was under an impact, such as vibrations, the impact may cause the cracks at the break-off end part to further spread around the metal bump $11a$. The vibration frequency drift was observed in many of the piezoelectric vibration pieces in which the cracks had spread around the metal bump.

To solve this problem, this invention provides for a piezoelectric wafer well-equipped to support piezoelectric vibration pieces in a manner that cracks generated at break-off end parts or near regions of the broken-off piezoelectric vibration pieces may be effectively prevented from further spreading around the metal bumps under an external force such as an impact load, and piezoelectric vibration pieces broken off from such a piezoelectric wafer.

A piezoelectric wafer according to this invention includes: piezoelectric vibration pieces; frame portions supporting the piezoelectric vibration pieces, and coupling portions coupling the piezoelectric vibration pieces to the frame portions, wherein the piezoelectric vibration pieces each have a pair of first and second metal bumps juxtaposed at an interval along a width direction of the coupling portion. The piezoelectric vibration pieces may be separately breakable at the coupling portions. The coupling portions each have a break-off assisting slit formed in the width direction except for a part of the coupling portion in the width direction. Width-direction ends of the part of the coupling portion in the width direction are distantly spaced from the metal bumps in a direction perpendicular to the width direction with no overlap with the metal bumps.

Preferably, "no overlap" refers to that neither of ends in the width direction of the part of the coupling portion in the width direction overlaps with any of the metal bumps.

In the piezoelectric wafer according to this invention thus characterized, cracks present at the break-off end part of the piezoelectric vibration piece broken off from the frame portion of this wafer may be prevented from further spreading around the metal bumps under an external force, such as an impact load, imposed on the piezoelectric vibration piece. According to this invention, therefore, the piezoelectric vibration piece separated from the piezoelectric wafer may be prevented from undergoing any vibration frequency drift under an impact from outside.

The impact possibly imposed on the broken-off piezoelectric vibration piece may be, for example, a vibratory pressure at the time of ultrasonic bonding of the metal bumps to electrode pads in the package of a piezoelectric vibration device when the separated piezoelectric vibration piece is mounted in the package.

In the piezoelectric vibration pieces further miniaturized to desirably increase the number of piezoelectric vibration pieces that can be obtained from one piezoelectric wafer, the metal bumps and bridges constituting the part of the coupling portion in the width direction may be more closely located. Yet, the cracks at the break-offend parts are unlikely to spread around the metal bumps.

Therefore, it may be advantageous to further miniaturize each piezoelectric vibration piece to obtain more piezoelectric vibration pieces from one piezoelectric wafer.

According to a preferred aspect of this invention, a section largest in width of the part of the coupling portion in the width direction is not overlapping with the metal bumps in the perpendicular direction.

According to this aspect, even if the part of the coupling portion in the width direction partly has a bent shape in the perpendicular direction, there is no overlap in the perpendicular direction between the metal bumps and a section largest in width of the part of the coupling portion in the width direction. This structural advantage may effectively prevent that any external force, such as an impact load, applied to the piezoelectric vibration piece causes the cracks at the break-off end part to further spread around the metal bumps.

In case the part of the coupling portion in the width direction is, for example, bent in the perpendicular direction and thereby changes in width, the piezoelectric vibration piece to be separated from the frame portion may be broken off at the narrowest part of the coupling portion having a poor strength. However, the point of origin of cracks is not necessarily the narrowest part of the coupling portion. Therefore, the part of the coupling portion in the width direction is preferably not overlapping, in its section largest in width, with the metal bumps in the perpendicular direction.

According to another preferred aspect of this invention, the part of the coupling portion in the width direction is distant from the metal bumps in the perpendicular direction by a dimension greater than or equal to 10 µm.

When the piezoelectric vibration piece is separated from the frame portion, the cracks originating from the part of the coupling portion in the width direction may spread to the break-off end part after the piezoelectric vibration piece is broken off. According to this aspect wherein the part of the coupling portion in the width direction is distantly spaced from the metal bumps in the perpendicular direction by a dimension greater than or equal to 10 µm, both ends of the break-off end part in the width direction may be far enough from the metal bumps to make it difficult for the cracks to reach the metal bumps.

According to yet another preferred aspect of this invention, the part of the coupling portion in the width direction is formed at a central position in the width direction between positions at which the metal bumps are juxtaposed.

According to this aspect, cracks, if any, at the break-off end part of the piezoelectric vibration piece may be more effectively prevented from further spreading around either one of the metal bumps. Therefore, it may be advantageous to further miniaturize each piezoelectric vibration piece to obtain more piezoelectric vibration pieces from one piezoelectric wafer.

According to yet another preferred aspect of this invention, the piezoelectric vibration piece further has a pair of vibration arm portions, a junction portion joined to an external element, and a base portion having the pair of vibration arm portions juxtaposed on one end surface thereof and the junction portion formed on the other end surface thereof opposite to the one end surface. The paired vibration arm portions are protruding in parallel to each other from the one end surface of the base portion. The junction portion has a basal end part formed at a middle position on the other end surface of the base portion in a direction in which the paired vibration arm portions are juxtaposed, and the basal end part has a first metal bump formed thereon. The junction portion further has an extended part extending from the basal end part toward one side in the width direction of the coupling portion, and the extended part has a second metal bump formed thereon. The junction portion, with these parts thus arranged, has an L-like shape in plan view. The first metal bump is greater in size in plan view than the second metal bump.

According to this aspect, the basal end part of the junction portion is formed at a middle position in the direction in which the paired vibration arm portions are juxtaposed, and the first metal bump is greater in size in plan view than the second metal bump. These structural advantages may allow the piezoelectric vibration piece separated from the frame portion to achieve generally well-balanced vibrations.

In case the piezoelectric vibration piece with any cracks generated when broken off from the frame portion at its break-off end part and/or vicinity thereof, if subject to an external force such as an impact load, this invention may prevent the cracks from further spreading around the metal bumps, maintaining desirable vibration frequency characteristics.

When the metal bumps of the piezoelectric vibration piece with any cracks generated at its break-off end part when broken off from the frame portion are, for example, bonded to electrode pads in the package of a piezoelectric vibrator by ultrasonic bonding, a vibratory pressure resulting from the ultrasonic bonding may be imposed on the piezoelectric vibration piece. Yet, this invention may prevent the cracks from further spreading around the metal bumps. As a result, the piezoelectric vibration piece may be operated at a required vibration frequency, and a piezoelectric vibrator mounted with this piezoelectric vibration piece may maintain desired vibration characteristics over a long term.

Further advantageously, this invention wherein outspread of the cracks is preventable may allow the metal bumps and the break-off end part to be located in proximity, thereby enabling further miniaturization of piezoelectric vibration pieces.

BRIEF DESCRIPTION OF THE DRAWINGS

FIG. 13a is an enlarged front surface view of a crystal vibration piece separated from the frame portion of the crystal wafer illustrated in FIG. 11a.

FIG. 14a is a partly enlarged front surface view of the crystal wafer illustrated in FIG. 12a.

FIG. 14b is an A-A sectional view of the illustration of FIG. 12a.

FIG. 15b is a B-B sectional view of the illustration of FIG. 15a.

FIG. 16b is a C-C sectional view of the illustration of FIG. 16a.

FIG. 17b is a D-D sectional view of the illustration of FIG. 17a.

FIG. 18a is a partly enlarged front surface view of a crystal wafer having a break-off part according to a fourth modified example of the second embodiment.

FIG. 18b is an E-E sectional view of the illustration of FIG. 18a.

FIG. 18c is a partly enlarged back surface view of the crystal wafer according to the second embodiment.

FIG. 22b is a back surface view of the crystal vibration piece illustrated in FIG. 22a.

FIG. 26 is a characteristic chart showing the vibration leakages in the crystal vibration piece according to the fourth embodiment illustrated in FIG. 22a.

FIG. 27 is an overall plan view of a crystal wafer for use in fabricating the crystal vibration piece according to the fourth embodiment illustrated in FIG. 22a.

DETAILED DESCRIPTION OF THE INVENTION

Hereinafter, first to fourth embodiments of this invention are described in detail referring to the accompanying drawings.

The embodiments of this invention use a Z-type crystal wafer. The invention, however, is not necessarily limited to crystal wafers and may be applicable to other wafers including piezoelectric wafers formed of piezoelectric materials, for example, lithium tantalate and lithium niobate. The embodiments describe a tuning-fork type crystal vibration piece as an example of the piezoelectric vibration pieces. However, the tuning fork type described in the embodiments is a non-limiting example. The invention may be applicable to other types of piezoelectric vibration pieces.

In the accompanying drawings, the same or similar structural elements are illustrated with the same reference signs. While some technical and/or structural features may repeatedly appear in the embodiments, the other technical and/or structural features may not be repeatedly described to avoid redundancy.

First Embodiment

Figure 1:
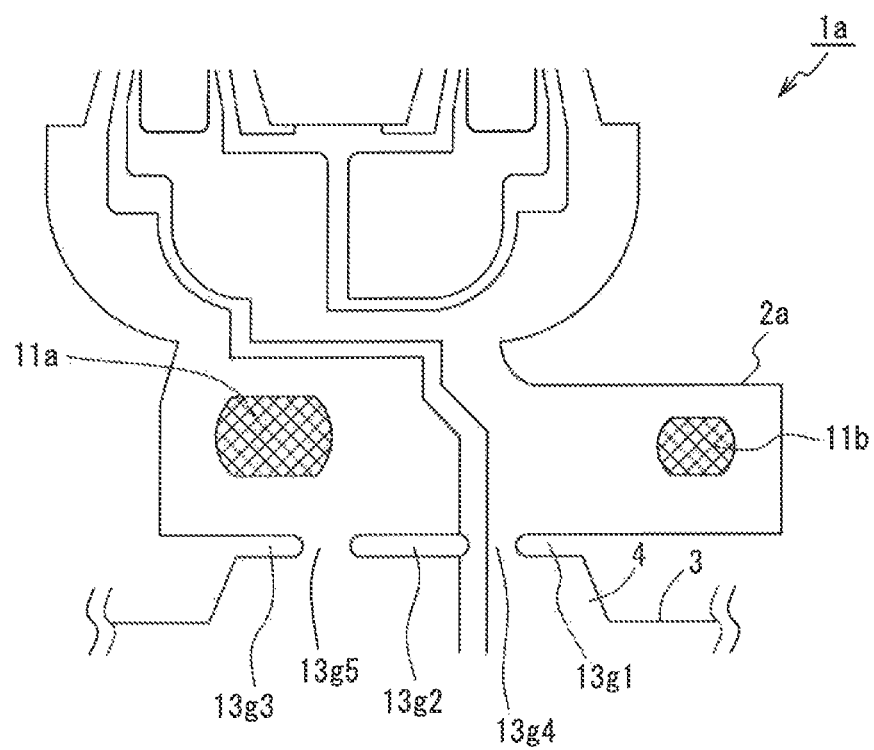
FIG. 1 is a partly enlarged plan view of a conventional piezoelectric wafer.
Figure 2:
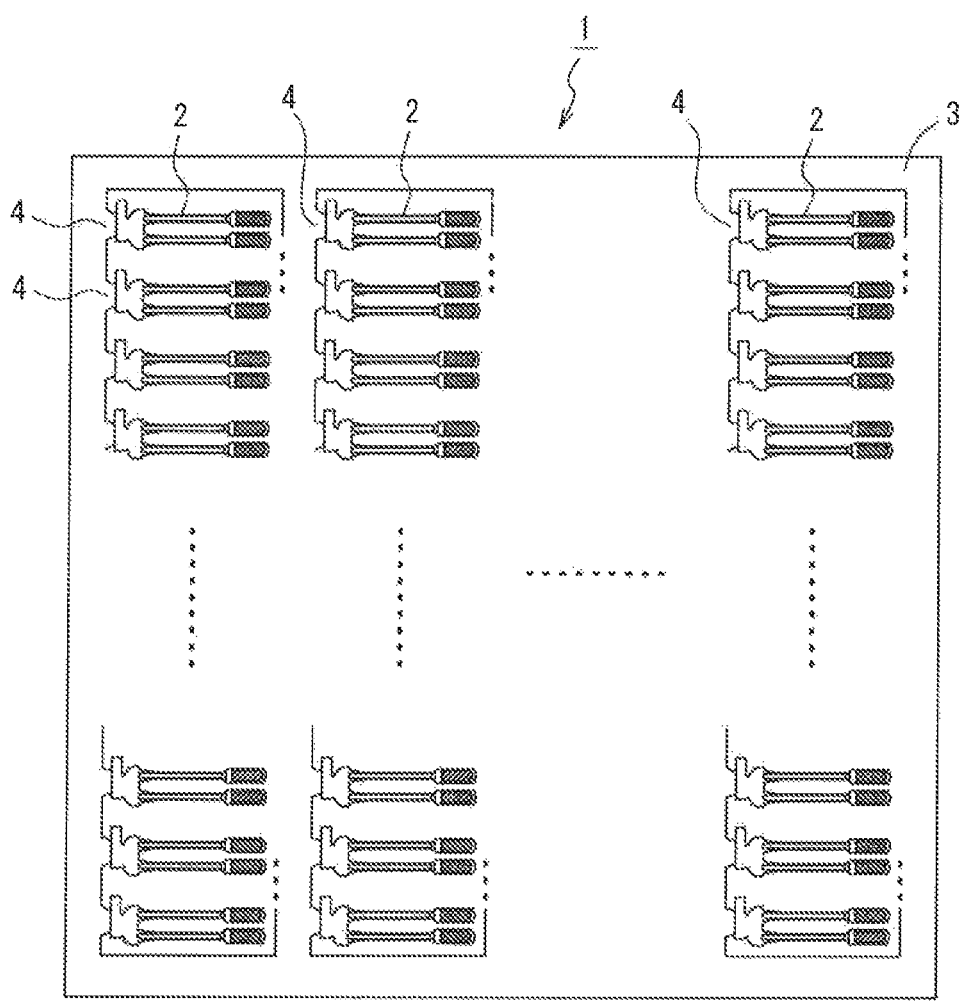
FIG. 2 is an overall view of a crystal wafer according to a first embodiment of the invention.
Figure 3A:
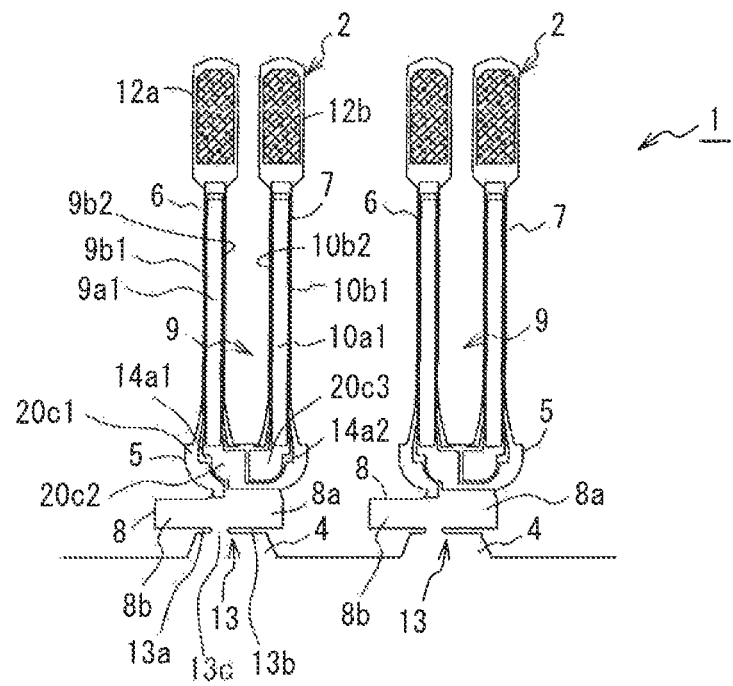
FIG. 3a is a partly enlarged view of the front-surface side of the crystal wafer illustrated in FIG. 2.
Figure 3B:
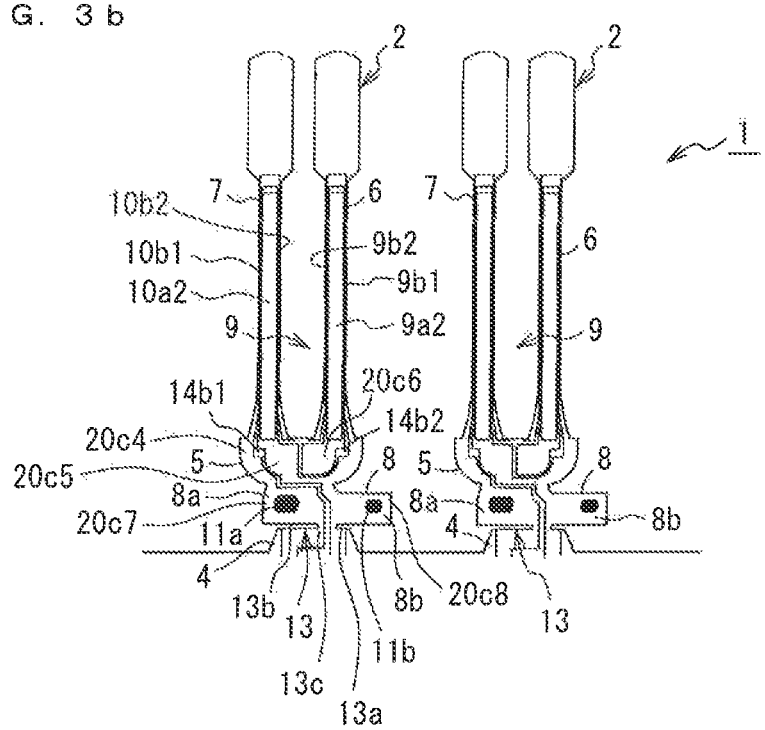
FIG. 3b is a partly enlarged view of the back-surface side of the crystal wafer illustrated in FIG. 2.
Figure 4:
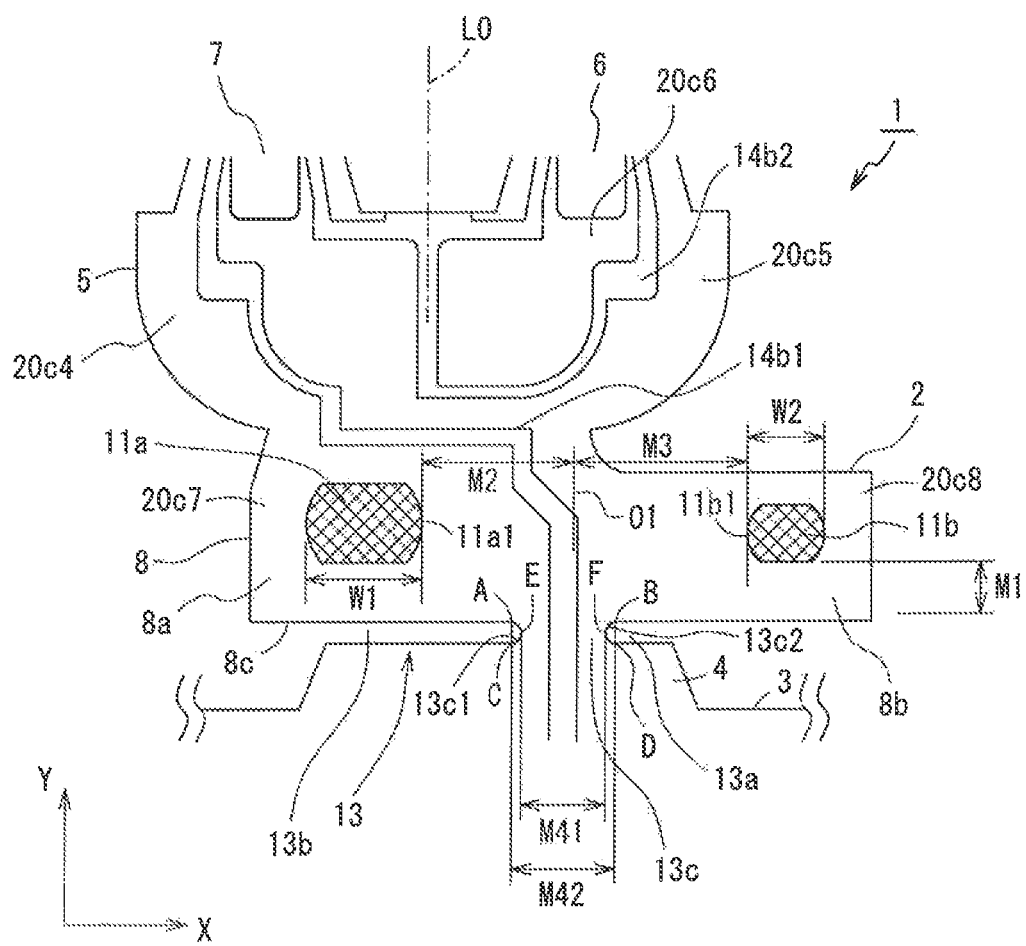
FIG. 4 is a further partly enlarged view of the back-surface side of the crystal wafer according to the first embodiment.

Referring to FIGS. 2 to 4, a crystal wafer according to a first embodiment of the invention is hereinafter described. A crystal wafer 1 according to this embodiment is obtained by cutting a crystal substrate in a plate-like shape. An example of the crystal substrate may be a crystal Z plate (X plane-cutting).

The crystal wafer 1 is fabricated by wet-etching a resist pattern formed by photolithography. As a result, the crystal wafer 1 is fabricated that has crystal vibration pieces 2, frame portions 3 supporting the crystal vibration pieces 2, and coupling portions 4 coupling the crystal vibration pieces 2 to the frame portions 3.

The crystal vibration piece 2 has a base portion 5, a pair of first and second vibration arm portions 6 and 7 as vibrating units, and a junction portion 8. The base portion 5 has a laterally symmetric shape in plan view and is greater in width than the first and second vibration arm portions 6 and 7.

The first and second vibration arm portions 6 and 7 are protruding from one end surface of the base portion 5 and juxtaposed in parallel to each other with an interval 9 interposed therebetween. The interval 9 is present at the center on the one end surface of the base portion 5 in a direction in which the first and second vibration arm portions 6 and 7 are juxtaposed.

A reference sign L0 in the drawings represents a central line between positions at which the first and second vibration arm portions 6 and 7 are juxtaposed. This central line L0 is extending downward along a direction in which these vibration arm portions are protruding in a direction opposite to the arm-protruding direction.

The first vibration arm portion 6 has driving electrodes 9a1, 9a2, 9b1, and 9b2 formed on its front and back surfaces and both side surfaces. The second vibration arm portion 7 has driving electrodes 10a1, 10a2, 10b, and 10b2 formed on its front and back surfaces and both side surfaces.

The driving electrodes 9a1 and 9a2 on the front and back surfaces of the first vibration arm portion 6 are connected to each other, and the driving electrodes 9b1 and 9b2 on the both side surfaces of the first vibration arm portion 6 are connected to each other. Likewise, the driving electrodes 10a1 and 10a2 on the front and back surfaces of the second vibration arm portion 7 are connected to each other, and the driving electrodes 10b1 and 10b2 on the both side surfaces of the second vibration arm portion 7 are connected to each other.

The driving electrodes 9a1 and 9a2 on the front and back surfaces of the first vibration arm portion 6 are respectively common-connected to the driving electrodes 10b1 and 10b2 on the side surfaces of the second vibration arm portion 7 to allow for the application of a voltage of a polarity. The driving electrodes 9b1 and 9b2 on the side surfaces of the first vibration arm portion 6 are respectively common-connected to the driving electrodes 10a1 and 10a2 on the front and back surfaces of the second vibration arm portion 7 to allow for the application of a voltage of the other polarity.

The driving electrodes of the first and second vibration arm portions 6 and 7 are partly extracted to extraction electrodes 20c1 to 20c6 on the base portion 5. Of the extraction electrodes 20c1 to 20c6, the extraction electrodes 20c4 and 20c5 on the back-surface side of the base portion 5 are further extracted to the junction portion 8, coupling portion 4, and frame portion 3, and serve as extraction electrodes 20c7 and 20c8 for applying the voltages of one and the other polarities.

The extraction electrodes 20c1 to 20c8 are electrically insulated from one another by discrete insulation lines 14a1, 14a2, 14b1, and 14b2.

Of the extraction electrodes 20c1 to 20c8, the extraction electrodes 20c1, 20c3, and 20c5 may be referred to as base portion extraction electrodes for connection by which the driving electrodes are partly common-connected, and the extraction electrodes 20c2, 20c4, and 20c6 may be referred to as base portion extraction electrode for external use by which the driving electrodes are partly externally extracted, collectively, as the base portion extraction electrodes 20c1 to 20c6. The extraction electrode 20c4, when extracted to the junction portion 8, may be referred to as a junction extraction electrode 20c7 for external use. The extraction electrode 20c5, when extracted to the junction portion 8, may be referred to as a junction extraction electrode 20c8 for external use.

The junction portion 8 has a basal end part 8a and an extended part 8b. The basal end part 8a is slightly protruding from the center position on the other end surface of the base portion 5 in the direction in which the first and second vibration arm portions 6 and 7 are juxtaposed. The extended part 8b is extending from the basal end part 8a toward one side in the direction in which the first and second vibration arm portions 6 and 7 are juxtaposed. The junction portion 8, with these parts thus arranged, has an L-like shape in plan view with respect to the base portion 5. Referring to the drawing, the basal end part 8a of the junction portion 8 has a protruding length with respect to the base portion smaller than the other. The junction portion 8 may have an L-like shape in plan view in which the basal end part 8a has a greater protruding length.

The first metal bump 11a having an elliptical shape in plan view is formed on the extraction electrode 20c7 of the basal end part 8a of the junction portion 8. The second metal bump 11b having an elliptical shape in plan view is formed on the extraction electrode 20c8 of the extended part 8b of the junction portion 8. These metal bumps are formed by electrolytic plating. The shapes of the first and second metal bumps 11a and 11b may be otherwise, for example, a circular shape in plan view. A preferable example of the electrolytic plating may be gold plating, which is, however, a non-limiting example.

As for the extraction electrodes 20c7 and 20c8, the driving electrodes of the crystal vibration piece 2 are extracted to the frame portion 3 through the junction portion 8 and the coupling portion 4, so that an external voltage applied to the first and second metal bumps 11a and 11b is applied to the driving electrodes of the crystal vibration piece 2. Also, the driving electrodes of the crystal vibration piece 2 are thus extracted to apply a voltage for frequency adjustment to these driving electrodes at the time of frequency adjustments before the crystal vibration piece 2 is broken off at the coupling portion 4.

When the crystal vibration piece 2 is mounted in the crystal vibration device not illustrated in the drawings, the first and second metal bumps 11a and 11b are bonded by ultrasonic bonding to a pair of opposing electrode pads on a part different in level or bottom surface of a package in the crystal vibration device.

The first metal bump 11a is formed at a position substantially at the center in the direction in which the first and second vibration arm portions 6 and 7 are juxtaposed. Specifically, the first metal bump 11a is formed at a position slightly displaced from the center position in the arm-juxtaposed direction toward one side in the arm-juxtaposed direction. The second metal bump 11b is formed at a position displaced from the center position in the direction in which the first and second vibration arm portions 6 and 7 are juxtaposed toward the other side in the arm-juxtaposed direction.

Each of the driving electrodes and the extraction electrodes may be, for example, a thin film including a chrome layer and a metal layer formed by vapor deposition. These thin films are subjected to metal etching after they are formed on the whole surface of the crystal wafer 1 by, for example, vapor deposition.

On the surfaces of the first and second vibration arm portions 6 and 7 are formed frequency-adjusting electrode portions for weight 12a and 12b, each having a metal film formed thereon by electrolyte plating, are formed. With the purpose of driving the crystal vibration piece 2 and adjusting its frequency to reach a required frequency, the frequency-adjusting electrode portions for weight 12a and 12b are decreased in mass by laser beam scan or ion etching for fine frequency adjustments. The coupling portion 4 has a break-off part 13. This part is a section of the coupling portion 4 in the width direction along the interface between the coupling portion 4 and the junction portion 8 of the crystal vibration piece 2. The break-off part 13 is extending across the entire width of the coupling portion 4 in the width direction.

The break-off part 13 has, on its both side-surface sides, slits 13a and 13b penetrating through the front and back surfaces of the coupling portion 4. The slits 13a and 13b are, however, not formed in a part of the coupling portion 4 in the width direction. The beak-off part 13 further has a bridge 13c, which is a slit-less part in the width direction, having a flat surface continuous to the front and back surfaces of the coupling portion.

According to the first embodiment, the slits 13a and 13b are penetrating through the front and back surfaces of the coupling portion 4. Instead, the slits may be non-penetrating grooved slits.

The crystal wafer 1 according to the first embodiment is further described referring to FIG. 4. In the drawing, a reference sign X represents the width direction of the coupling portion 4, and a reference sign Y represents a direction perpendicular to the width direction. In the description below, the X and Y directions may be respectively used to refer to the width direction and the perpendicular direction.

In this crystal wafer 1, reference signs, W1 and W2, refer to widths of the first and second metal bumps 11a and 11b, respectively. The widths W1 and W2 may preferably be 0.1 to 0.4 µm.

A reference sign M1 refers to a distance in the perpendicular direction between an end surface 8c of the junction portion 8 closer to the coupling portion 4 and the bottom section of the first, second metal bump 11a, 11b. The distance M1 may preferably be greater than or equal to 10 µm. This distance may be rephrased as a distance between an upper edge A, B of the bridge 13c and the bottom section of the first, second metal bump 11a, 11b.

A reference sign M2 refers to a distance between a center O1 of the bridge 13c in the width direction and one end 11a1 of the first metal bump 11a in the width direction. A reference sign M3 refers to a distance between the center O1 of the bridge 13c in the width direction and one end 11b1 of the second metal bump 11b in the width direction.

The bridge 13c is formed by etching the slits 13a and 13b. Therefore, both ends 13c1 and 13c2 of the bridge 13c have a shape not straight in the perpendicular direction but bent in a recessed shape when viewed from the slits 13a and 13b. The distances M2 and M3 have a relationship expressed by M2>M42/2, M3>M42/2, where M and M42 are respectively a smallest width and a greatest width of the both ends 13c1 and 13c2 of the bridge 13. Referring to reference signs illustrated in the drawing, A and B define an upper-side part largest in width of the bridge 13c, C and D define a lower-side part largest in width of the bridge 13c, and E and F define a part smallest in width of the bridge 13c between the widest upper-side part A, B and the widest lower-side part C, D.

According to the relationship between these distances, one end 11a1 of the first metal bump 11a is distantly spaced in the width direction from one end 13c1 of the bridge 13c, and one end 11b1 of the second metal bump 11b is distantly spaced in the width direction from the other end 13c2 of the bridge 13c. Accordingly, neither of one end 13c1 nor the other end 13c2 of the bridge 13c overlaps with the first metal bump 11a or the second metal bump 11b in the perpendicular direction.

The widths W1 and W2 of the first and second metal bumps 11a and 11b are not particularly limited in so far as the before-mentioned relationship is met. The widths of the bridge 13c are not particularly limited unless there is any overlap with the first and second metal bumps 11a and 11b.

In case the crystal vibration piece 2 to be separated is broken off at the break-off part 13 of the coupling portion 4, the crystal vibration piece 2 may be broken off at the smallest-in-width part (between E and F) of the bridge 13c poor in strength. Despite the fact that cracks may be likely to occur in the smallest-in-width part, cracks possibly originate from the upper part defined by A, B at the both ends 13c1 and 13c2 of the bridge 13c. In view of the possibility, the largest-in-width part (between A and B) of the bridge 13c is preferably not overlapping with the first or second metal bump 11a or 11b in the perpendicular direction.

According to this embodiment, it is necessary that neither of one end 13c1 nor the other end 13c2 of the bridge 13c overlap with the first metal bump 11a or the second metal bump 11b. It is necessary that neither of one end 13c1 nor the other end 13c2 of the bridge 13c overlap with the first metal bump 11a or the second metal bump 11b in the perpendicular direction.

According to this embodiment, the bridge 13c is located away by a few µm or more from the first and second metal bumps 11a and 11b in the perpendicular direction. Therefore, the bridge 13c is not overlapping with these metal bumps in the perpendicular direction. However, the distances between the both ends 13c1 and 13c2 of the bridge 13c and the one ends 11a1 and 11b1 of the first and second metal bumps 11a and 11b should preferably exceed 0 m unless cracks further spread around the first, second metal bump 11a, 11b.

Figure 5A:
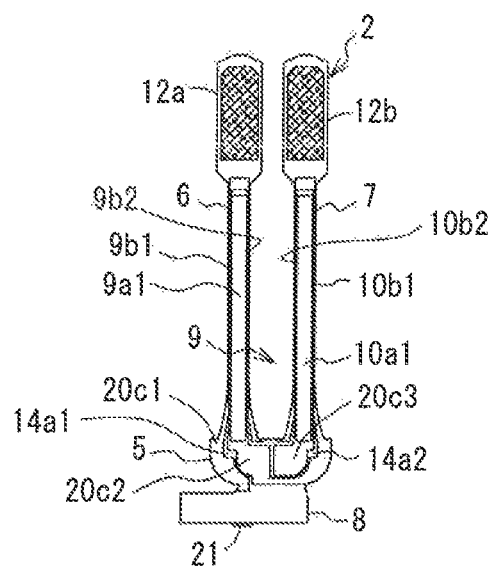
FIG. 5a is a front surface view of a crystal vibration piece separated from a frame portion of the crystal wafer illustrated in FIG. 2.
Figure 5B:
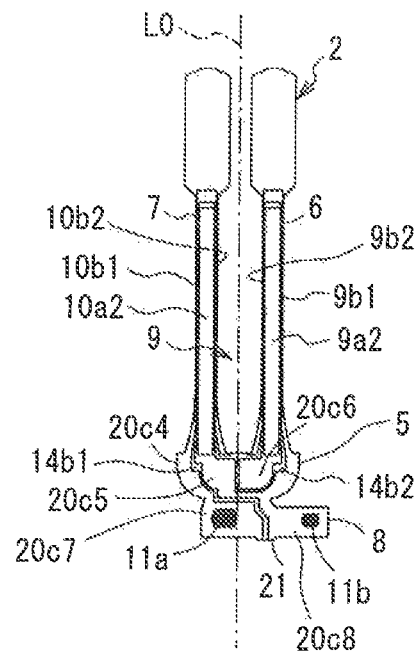
FIG. 5b is a back surface view of the crystal vibration piece separated from the frame portion of the crystal wafer illustrated in FIG. 2.
Figure 6:
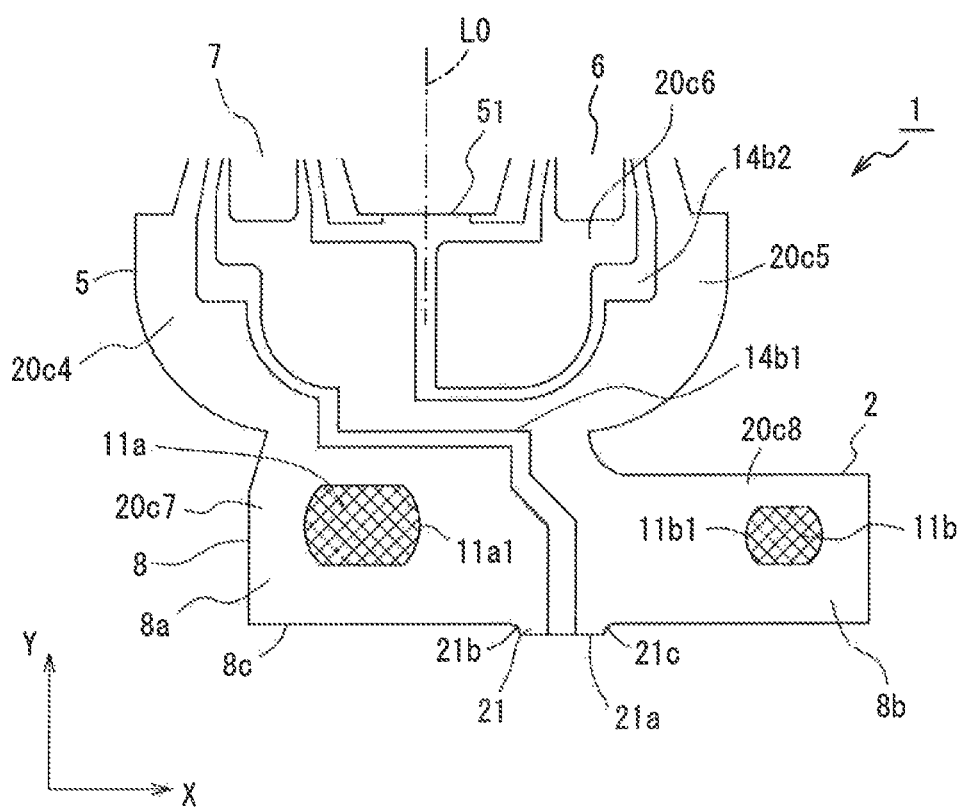
FIG. 6 is an enlarged back surface view of the crystal vibration piece illustrated in FIG. 5b.

The crystal vibration pieces 2 are broken off at their break-off parts 13 and separated from the crystal wafer 1 illustrated in FIGS. 2 to 4 into individual pieces as illustrated in FIGS. 5a, 5b, and 6. FIG. 5a is a front surface view of the crystal vibration piece 2. FIG. 5b is a back surface view of the crystal vibration piece 2. FIG. 6 is a partly enlarged back surface view of the crystal vibration piece 2 illustrated in FIG. 5b. The crystal vibration pieces 2 coupled to the frame portions 4 in the crystal wafer 1 illustrated in FIGS. 2 to 4 are broken off at the coupling portions 4, and separated into individual pieces as illustrated in FIGS. 5a, 5b, and 6.

Each of the separated crystal vibration pieces 2 has a break-off end part 21 on an end surface of the junction portion 8. The break-off end part 21 is formed from the bridge 13c when the crystal vibration piece 2 is separated from the frame portion 3. Based on the before-mentioned relationship, upper parts of both ends 21b and 21c of the break-off end part 21 in the width direction are distantly spaced in the perpendicular direction from the bottom sections of the first and second metal bumps 1a and 11b closer to the one ends 11a1 and 11b1. The both ends 21b and 21c of the break-off end part 21 thus arranged are not overlapping with the first and second metal bumps 1a and 11b in the perpendicular direction.

As illustrated in the drawing, preferably, the both ends 21b and 21c of the break-off end part 21 are not straight in the perpendicular direction but are bent in a recessed shape, and the upper parts of the both ends 21b and 21c of the break-off end part 21 are not overlapping with the first and second metal bumps 1a and 11b in the perpendicular direction. On the back surface of the break-off end part 21, the extraction electrodes 20c7 and 20c8 are extracted to the break-off end 21a.

The first and second metal bumps 11a and 11b of the crystal vibration piece 2 are bonded by ultrasonic bonding to the electrode pads in the package of the crystal vibration device. As described earlier, the first and second metal bumps 11a and 11b are distant from the break-off end part 21 with no overlap with the both ends 21b and 21c of the break-off end part 21. In the even that cracks generated in the crystal vibration piece 2 when separated from the wafer are present at and/or near the break-off end part 21, therefore, it may be prevented that the cracks further spread around the first, second metal bump 11a, 11b under any impact imposed on the crystal vibration piece at the time of ultrasonic bonding.

Figure 7:
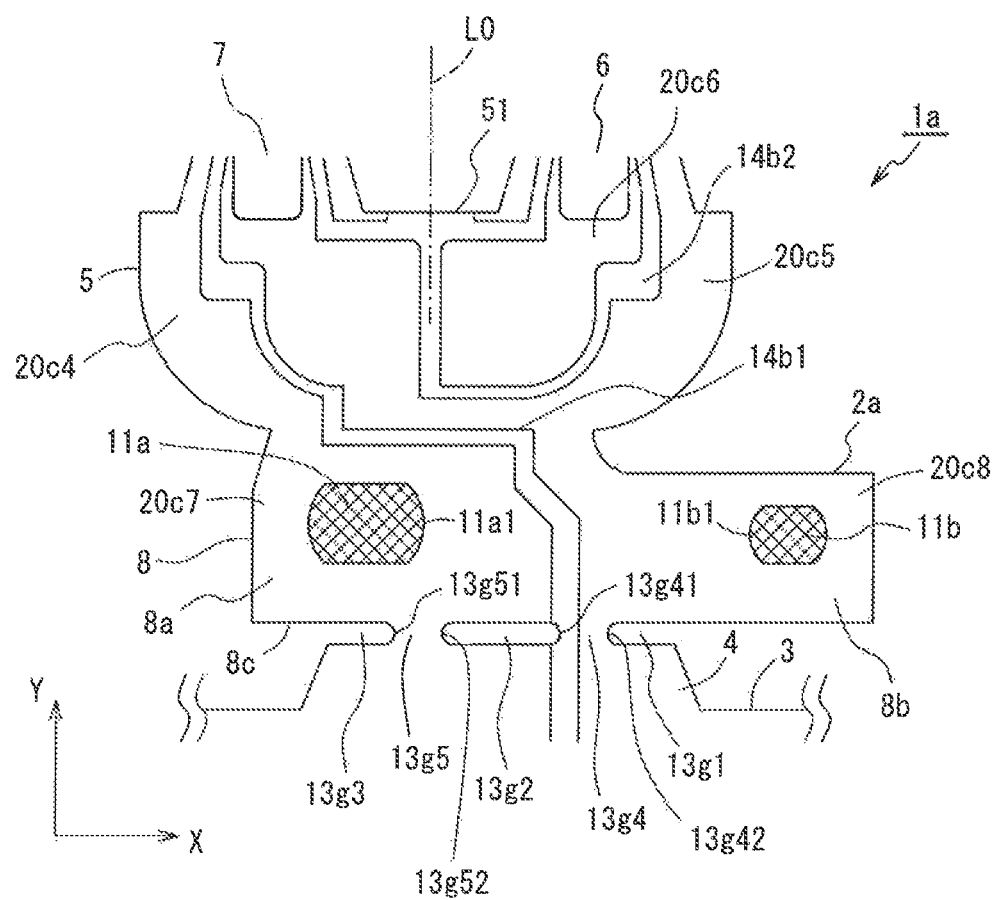
FIG. 7 is a partly enlarged back surface view of a crystal wafer according to a comparative example.

A test was carried out to measure an vibration frequency drift when an external force, such as an impact load, was applied to the crystal vibration piece 2 of FIG. 6 separated from the crystal wafer 1 of FIG. 4 and a crystal vibration piece 2a separated from a crystal wafer 1a illustrated in FIG. 7 as a comparative example (the separated crystal vibration piece 2a is not illustrated in the drawing).

Figure 8A:
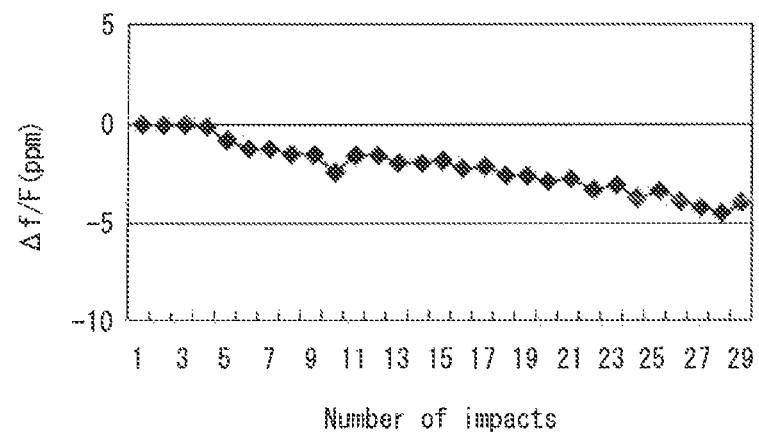
FIG. 8a is a frequency drift characteristic chart of a result obtained by imposing an impact on a crystal vibration piece separated from the crystal wafer according to the comparative example.
Figure 8B:
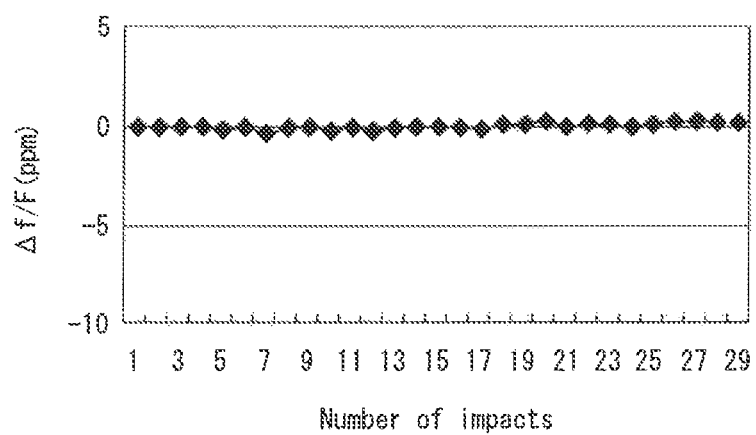
FIG. 8b is a frequency drift characteristic chart of a result obtained by imposing an impact on a crystal vibration piece separated from the crystal wafer according to the first embodiment.

FIGS. 8a and 8b are frequency drift characteristic charts of the test results on the crystal vibration pieces 2 and 2a. The frequency drift characteristics of these crystal vibration pieces 2 and 2a are hereinafter described by way of comparison.

FIG. 7 is a partly enlarged back surface view of the crystal wafer 1a illustrated as a comparative example, wherein the same structural elements as those of FIG. 6 are illustrated with the same reference signs. The crystal wafer 1a of FIG. 7 has, as break-off parts, slits 13g1 to 13g3 and bridges 13g4 and 13g5 among the slits 13g1 to 13g3. Reference signs, 13g41 and 13g42 represent both ends of the bridge 13g4, and reference signs 13g51 and 13g52 represent both ends of the bridge 13g5.

One end 11a1 of the first metal bump 11a is located in the perpendicular direction between the both ends 13g51 and 13g52 of the bridge 13g5. The first metal bump 11a is overlapping in the Y direction with the one end 13g51 of the bridge 13g5. The second metal bump 11b is overlapping with neither of the bridge 13g4 nor 13g5 in the Y direction or perpendicular direction.

Referring to FIGS. 8a and 8b, the lateral axis indicates the number of times when an external impact is applied to the crystal vibration pieces 2 and 2a over times by tapping or dropping them, and the longitudinal axis indicates a frequency drift, Δf/F (ppm), from a vibration frequency F required in the crystal vibration piece 2.

In the crystal vibration piece 2a of the comparative example separated from the crystal wafer 1a of FIG. 7, the vibration frequency F shifts by degrees to the minus side in proportion to an increasing number of impacts as illustrated in FIG. 8a. This is the indication of outspread of the cracks around the first, second metal bump 11a, 11b in the crystal vibration piece 2a of the comparative example separated from the crystal wafer 1a.

In the piezoelectric vibration piece 2 according to this embodiment separated from the crystal wafer 1, on the other hand, the frequency drift Δf/F from the required vibration frequency F was hardly observed regardless of an increasing number of impacts. This clearly demonstrates that outspread of the cracks around the first, second metal bump 11a, 11b may be effectively preventable against an increasing number of impacts.

As described so far, in the crystal wafer 1 according to the first embodiment, an external force, such as an impact load, repeatedly applied thereto does not cause the cracks to spread around the first, second metal bump 11a, 11b, and the vibration frequency drift was hardly observed. This result may be attributed to its advantageous structural feature; no overlap between the bridge 13c of the coupling portion 4 and the first and second metal bumps 11a and 11b of the crystal vibration piece 2.

When the crystal vibration piece 2 separated from the crystal wafer 1 according to the first embodiment is later mounted in the package of the crystal vibration device, the first and second metal bumps 11a and 11b of the crystal vibration piece 2 are bonded to the electrode pads in the package by ultrasonic bonding, and a vibrational pressure at the time of ultrasonic bonding may act as an external force, impacting the crystal vibration piece 2. Yet, it may be prevented or suppressed that any cracks generated in the break-off end part 21 of the crystal vibration piece 2 further spread around the first, second metal temp 11a, 11b. In consequence of this effect, any frequency drift from the required vibration frequency may be prevented or suppressed in the crystal vibration piece 2.

This may stabilize the vibration frequency of the separated piezoelectric vibration piece 2. When multiple piezoelectric vibration piece 2 are to be obtained from one piezoelectric wafer 1, therefore, it may be advantageous to further miniaturize each piezoelectric vibration piece 2 to obtain more piezoelectric vibration pieces 2 from the crystal wafer. Thus, the first embodiment may enable further miniaturization of the piezoelectric vibration pieces 2.

In the piezoelectric vibration piece 2 further miniaturized, the bridge 13f of the coupling portion 4 and the first and second metal bumps 11a and 11b may be more closely located, and any cracks present in the break-off end part at the time of separating the crystal vibration piece are more likely to further spread around the first, second metal bump 11a, 11b. This embodiment advantageous as described so far may effectively prevent the cracks from further spreading around the first, second metal bump 11a, 11b. This embodiment, therefore, may enable further miniaturization of the piezoelectric vibration pieces 2, thereby increasing the number of piezoelectric vibration pieces 2 obtainable from one piezoelectric wafer.

Figure 9:
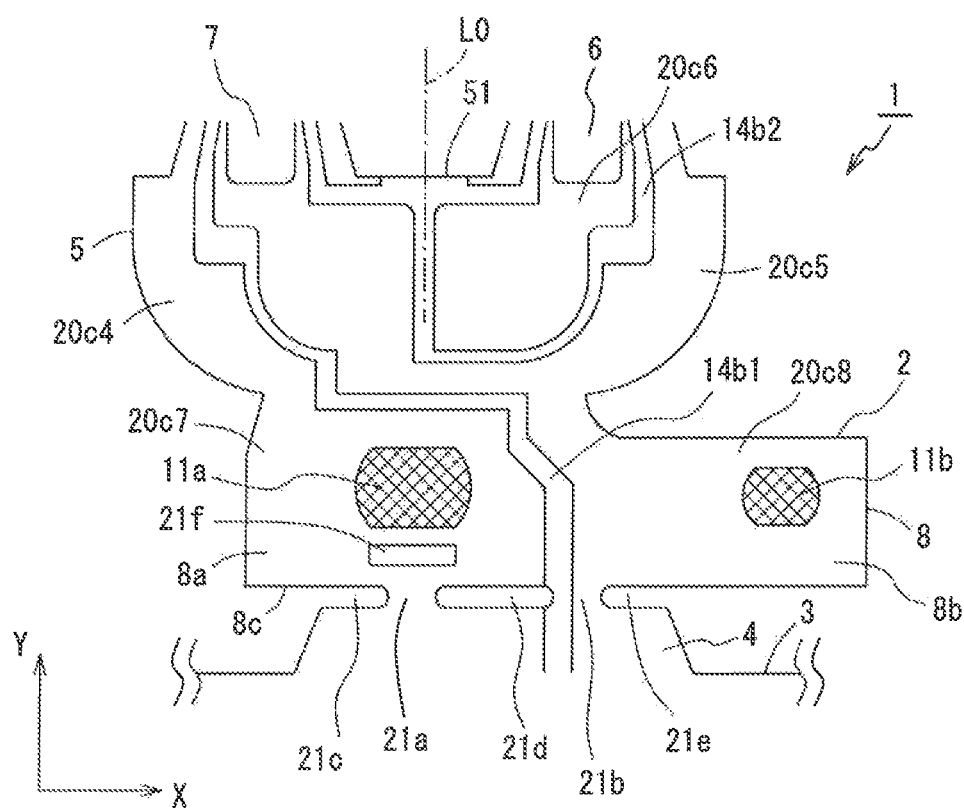
FIG. 9 is a partly enlarged back surface view of a crystal wafer according to a modified example of the first embodiment.
Figure 10:
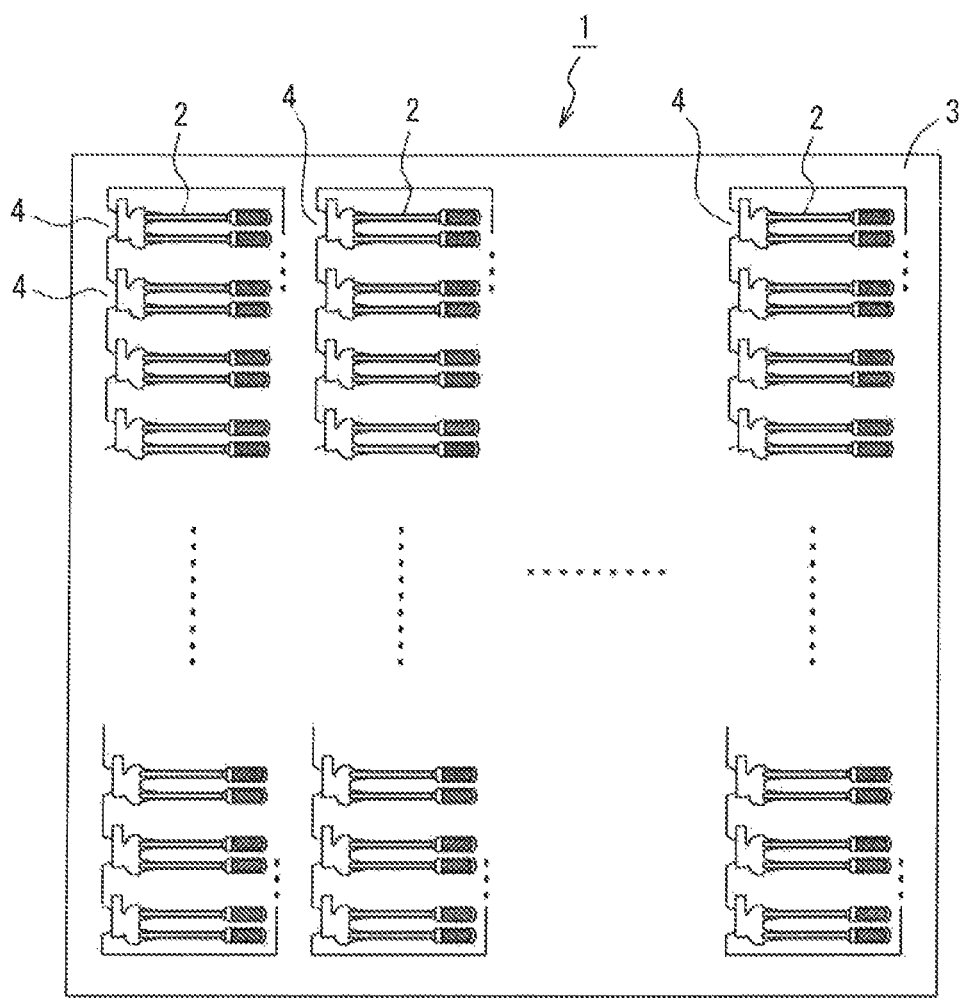
FIG. 10 is an overall view of a crystal wafer according to a second embodiment of the invention.
Figure 11A:
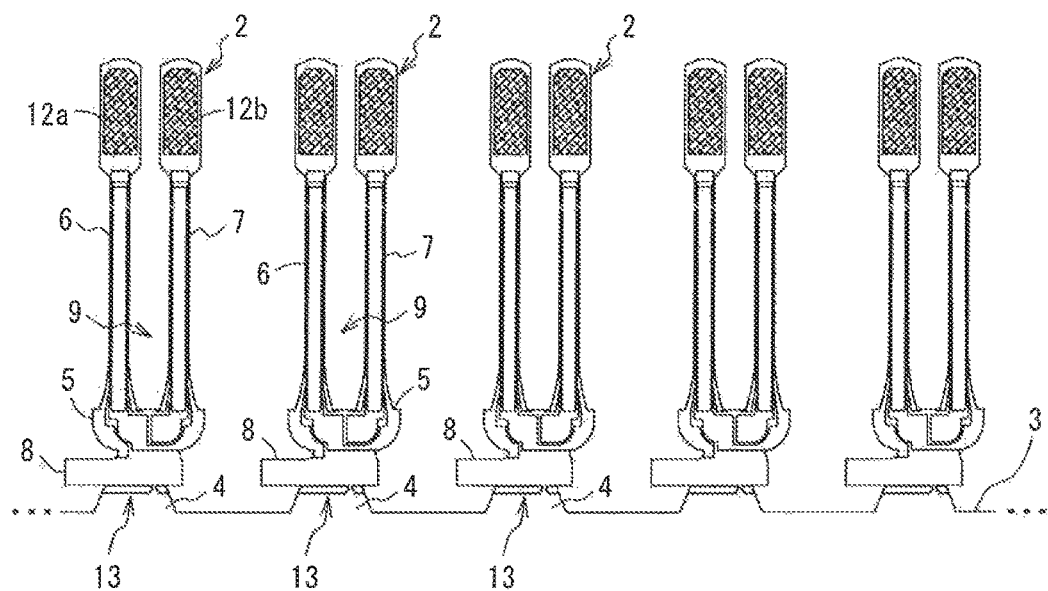
FIG. 11a is a partly enlarged view of the front-surface side of the crystal wafer illustrated in FIG. 10.
Figure 11B:
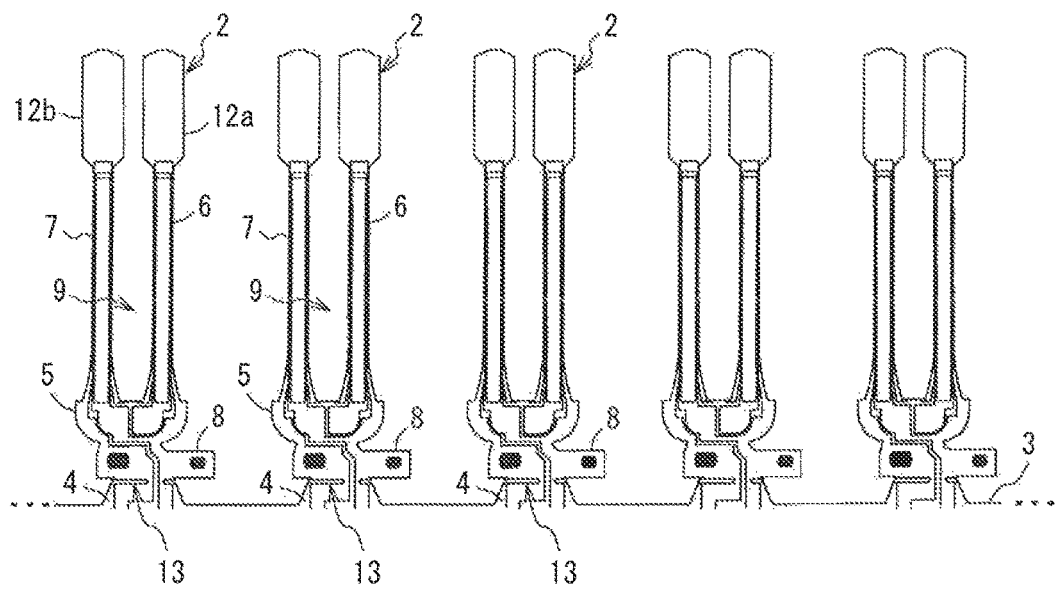
FIG. 11b is a partly enlarged view of the back-surface side of the crystal wafer illustrated in FIG. 10.
Figure 12A:
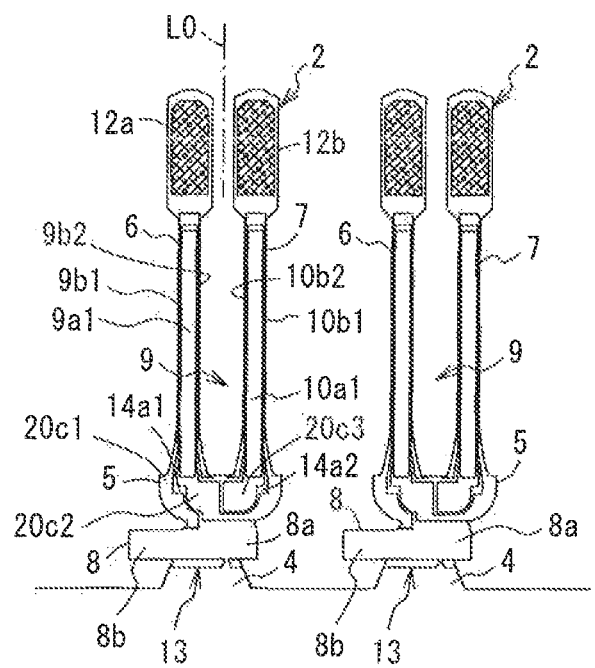
FIG. 12a is an enlarged front surface view of crystal vibration pieces before being separated from a frame portion of the crystal wafer illustrated in FIG. 11a into individual pieces.
Figure 12B:
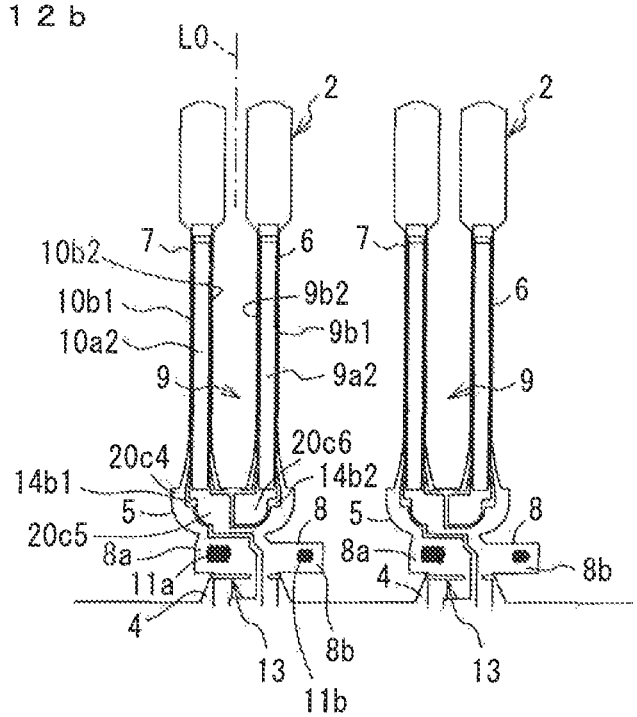
FIG. 12b is an enlarged back surface view of the crystal vibration pieces before being separated from the frame portions of the crystal wafer illustrated in FIG. 11b into individual pieces.

FIG. 9 is a partly enlarged back surface view of the crystal wafer 1, from which the crystal vibration pieces 2 are yet to be separated from the frame portions 3, according to a modified example of the first embodiment.

In the crystal wafer 1 illustrated in FIG. 9, the break-off part 13 has three slits 21c to 21e and two bridges 21a and 21b on its back-surface side. The extraction electrodes 20c4 and 20c5 are extracted to the bridge 21b from the junction portion-8 side. The bridge 21a is overlapping with the first metal bump 11a in the perpendicular direction. A crack-stop slit 21f is formed between the bridge 21a and the first metal bump 11a. This slit 21f is a groove not penetrating through the junction portion 8.

When the crystal vibration pieces 2 are broken off at the break-off parts 13 of the coupling portions 4 and separated from the crystal wafer 1 further provided with the slits 21f into individual pieces, cracks possibly occur at the lower end of the junction portion 8 in any one of the crystal vibration pieces 2. Yet, the slit 21f may serve to prevent the cracks from further spreading around the first metal bump 11a at the time of ultrasonic bonding of the first and second metal bumps 11a and 11b when the separated crystal vibration piece 2 is mounted in the package of the crystal vibration device.

The other slit 21b is distantly spaced in the perpendicular direction from the first and second metal bumps 11a and 11b and is overlapping with neither of the first nor second metal bump 11a, 11b. For the same reason as described earlier, the cracks at the bridge 21b generated when breaking off the crystal vibration piece 2 may be prevented from further spreading around the first, second metal bump 11a, 11b.

When the crystal vibration piece 2 separated from the crystal wafer 1 is mounted in the package of the crystal vibration device, the first and second metal bumps 11a and 11b are bonded to the electrode pads by ultrasonic bonding. Yet, any cracks may be prevented from further spreading around the first, second metal bump 11a, 11b, and any frequency drift in operating the crystal vibration device mounted with the crystal vibration piece 2 may be prevented or suppressed as with the embodiment described earlier.

According to this modified example, therefore, the cracks may be prevented by the slit 21f from further spreading around the first metal bump 11a, and the crystal vibration pieces may be further miniaturized to desirably increase the number of crystal vibration pieces obtainable from one piezoelectric wafer 1.

Second Embodiment

Notably, a photolithography-utilized fabrication technique, when processing a piezoelectric wafer in an outer shape in which a large number of piezoelectric vibration pieces are supported by the frame portions via the coupling portions, simultaneously forms grooved slits as well that render the piezoelectric vibration pieces easily breakable at the coupling portions when separated from the frame portions. Then, an electrode film is formed by vapor deposition on the entire surface of a piezoelectric wafer material formed in such an outer shape and etched into required electrode patterns. In case the piezoelectric vibration piece is, for example, a tuning-fork type piezoelectric vibration piece, the required electrode patterns may include the patterns of driving electrodes on front, back, and side surfaces of vibration arm portions.

Before breaking off the piezoelectric vibration pieces from the piezoelectric wafer, the piezoelectric vibration pieces are driven through voltage application, and the electrodes may be scraped off for coarse frequency adjustments. To enable voltage application for frequency adjustments in the piezoelectric vibration piece, the required electrode patterns should necessarily include patterns of a pair of electrodes for frequency adjustment to extract the driving electrodes from the coupling portion to the frame portion.

It may be useful in breaking off the piezoelectric vibration piece from the frame portion to form the grooved slits linearly across the entire width of the coupling portion.

As described earlier, the electrode film is formed on the whole surface of the piezoelectric wafer material. The electrode film formed at this stage may possibly be left unetched on the side surfaces of the coupling portions and may also be left unetched in the grooved slits, incurring inter-electrode electrical short circuits in the driving electrodes on the both vibration arm portions of the piezoelectric vibration piece. Beside this possible problem, it is necessary to extract the electrodes for frequency adjustment avoiding any contact with the grooved slits in order to prevent the occurrence of wire disconnection in the electrodes for frequency adjustment.

According to an aspect of the second embodiment, grooved slits extending along the width direction of the coupling portion are formed on the front and back surfaces of the coupling portion except for a part of the coupling portion in the width direction, and electrodes of the piezoelectric vibration piece are extracted to the frame-portion side of the piezoelectric wafer by way of the part of the coupling portion in the width direction.

According to this aspect, the piezoelectric vibration piece may be easily broken off and separated from the frame portion with the aid of the grooved slits formed in the coupling portion. Further advantageously, while electrical short circuit is possible between the electrode film remaining in the grooved slits and the electrode film remaining on one of the side surfaces of the coupling portion, the part of the coupling portion in the width direction may serve to prevent electrical short circuit between the electrode film remaining on one of the side surfaces of the coupling portion and the electrode film remaining on the other one of the side surfaces of the coupling portion. Thus, it may be avoidable that the electrodes on the two vibration arm portions of the piezoelectric vibration piece are both electrically short-circuited. Then, the piezoelectric vibration piece may be driven through voltage application to both of the electrodes. In this piezoelectric wafer, the electrodes of the piezoelectric vibration piece are extracted to the frame-portion side by way of the part of the coupling portion in the width direction. Extracting the electrodes of the piezoelectric vibration piece in this manner may avoid wire disconnection and/or electrical short circuits unlike extracting the electrodes of the piezoelectric vibration piece through the grooved slits.

According to another aspect of the second embodiment, the grooved slits are formed on both sides of the part of the coupling portion in the width direction in a manner that the part is interposed between the grooved slits.

It is possible in the piezoelectric wafer that electrical short circuit occurs between the electrode film remaining on one of the side surfaces of the coupling portion and the electrode film remaining in the grooved slit on one of the sides across the part in the width direction. It is also possible that electrical short circuit occurs between the electrode film remaining on the other one of the side surfaces of the coupling portion and the electrode film remaining in the grooved slit on the other of the sides across the part in the width direction. According to this aspect wherein the grooved slits formed on both sides of the part of the coupling portion in the width direction in a manner that the part is interposed between the grooved slits, electrical short circuit may be avoidable between the remaining electrode films on the both surfaces of the coupling portion.

According to yet another aspect of the second embodiment, the electrodes extracted to the frame-portion side constitute a pair of electrodes for frequency adjustment, and the pair of electrodes for frequency adjustment are formed on one of the front and back surfaces of the coupling portion.

According to this aspect, the electrodes extracted to the frame-portion side of the piezoelectric wafer are the paired electrodes for frequency adjustment. Unlike electrodes extracted through the grooved slits, the paired electrodes for frequency adjustment may be extractable to the frame-portion side of the piezoelectric wafer without inviting the risks of wire disconnection and/or electrical short circuits. Before the piezoelectric vibration piece is broken off and separated from the frame portion, the piezoelectric vibration piece may be adjustable in frequency through voltage application for frequency adjustments to the electrodes. Since individual electrodes constituting the paired electrodes for frequency adjustment are formed on one of the surfaces of the coupling portion, it may advantageously be compatible with a frequency adjustment mechanism of a piezoelectric vibration piece with measurement terminals arranged alone on its one surface of the frame-portion side in the same manner.

With the paired electrodes for frequency adjustment being formed on one of the front and back surfaces of the coupling portion, extracting the electrodes of the piezoelectric vibration piece as the electrodes for frequency adjustment becomes unnecessary in the part of the coupling portion in the width direction on the other one of the front and back surfaces of the coupling portion. This may allow the part in the width direction to be reducible in width, rendering the piezoelectric vibration piece easily breakable at the coupling portion.

According to yet another aspect of the second embodiment, the electrodes extracted to the frame-portion side constitute a pair of electrodes for frequency adjustment, and one electrode and another electrode of the pair of electrodes for frequency adjustment are respectively formed on the front and back surfaces of the coupling portion.

As with the aspect described earlier, the paired electrodes for frequency adjustment may be extractable to the frame-portion side of the piezoelectric wafer without wire disconnection and/or electrical short circuits unlike electrodes extracted through the grooved slits. Before the piezoelectric vibration piece is broken off and separated from the frame portion, the piezoelectric vibration piece may be adjustable in frequency through voltage application for frequency adjustments to the electrodes. According to this aspect, since individual electrodes constituting the pair of electrodes for frequency adjustment are respectively formed on the front and back surfaces of the coupling portion, it may advantageously be compatible with the frequency adjustment mechanism of a piezoelectric vibration piece with measurement terminals arranged on its front and back surfaces in the same manner.

According to this aspect, unlike the earlier aspect, individual electrodes constituting the paired electrodes for frequency adjustment are formed on the front and back surfaces of the coupling portion. This may allow for width reductions of the parts in the width direction on the front and back surfaces of the coupling portion, rendering the piezoelectric vibration piece easily breakable at the coupling portion.

According to yet another aspect of the second embodiment, a plurality of the grooved slits are formed on each of the front and back surfaces of the coupling portion along the width direction.

According to this aspect, the plural grooved slits are formed on each of the front and back surfaces of the coupling portion along the width direction. Then, the grooved slits may be partly overlapping with one another on the front and back surfaces of the coupling portion in a thickness direction thereof to have the coupling portion be reduced in thickness at the slit-overlapping position. This may render the piezoelectric vibration piece more easily breakable at the coupling portion.

According to yet another aspect of the second embodiment, the parts of the coupling portion in the width direction on the front and back surfaces thereof are formed at positions displaced from each other in the width direction.

According to this aspect wherein the parts of the coupling portion large in thickness on the front and back surfaces thereof are formed at positions displaced from each other in the width direction, it may be avoidable that a certain area of the coupling portion is locally increased in thickness. This may render the piezoelectric vibration piece even more easily breakable at the coupling portion.

According to the second embodiment, the piezoelectric vibration piece broken off and separated from the frame portion of the piezoelectric wafer has a break-off end part. This break-off end part has planar parts to which the front and back surfaces of the piezoelectric vibration piece are continuous as far as a break-off end of the break-off end part, and bent parts in which the front and back surfaces of the piezoelectric vibration piece are bending. On the front and back surfaces, the bent parts are bending toward the front-surface side or the back-surface side of the piezoelectric vibration piece to reduce in thickness. In the planar part to which at least one of the front and back surfaces is continuous, the electrodes of the piezoelectric vibration piece are extracted to the break-off end.

Possibly, the electrode film may be left on the both side surfaces of the piezoelectric vibration piece broken off and separated from the frame portion of the piezoelectric wafer, and may also be left at the bent parts on the front and back surfaces of the break-off end part. In this piezoelectric vibration piece having the planar parts, the planar parts serve to prevent electrical short circuit between the electrode films on the side surfaces of the piezoelectric vibration piece. This piezoelectric vibration piece, therefore, may be driven as required through voltage application to the electrodes.

In the piezoelectric vibration piece, preferably, the planar part to which the front surface of the piezoelectric vibration piece is continuous and the planar part to which the back surface of the piezoelectric vibration piece is continuous are formed at positions displaced from each other in the direction in which the piezoelectric vibration piece is broken off.

In the piezoelectric vibration piece, preferably, the electrodes extracted to the break-end constitute a pair of electrodes for frequency adjustment, and the pair of electrodes for frequency adjustment is formed in the planar part to which one of the front and back surfaces is continuous.

In the piezoelectric vibration piece, preferably, the electrodes extracted to the break-end constitute a pair of electrodes for frequency adjustment, and one electrode and another electrode of the pair of electrodes for frequency adjustment are formed in the planar parts to which the front and back surfaces are continuous First, the second embodiment is described referring to FIGS. 10, 11a, 11b, 12a, and 12b. Any like features and/or components redundant with those of the piezoelectric wafer according to the first embodiment will not be described again.

In the piezoelectric wafer 1 according to the second embodiment, the coupling portion 4 has a break-off part 13 described later. This part is a section of the coupling portion 4 formed across its entire width in the width direction along the interface between the coupling portion 4 and the junction portion 8 of the crystal vibration piece 2. This break-off part 13 will be described later in further detail.

Figure 13A:
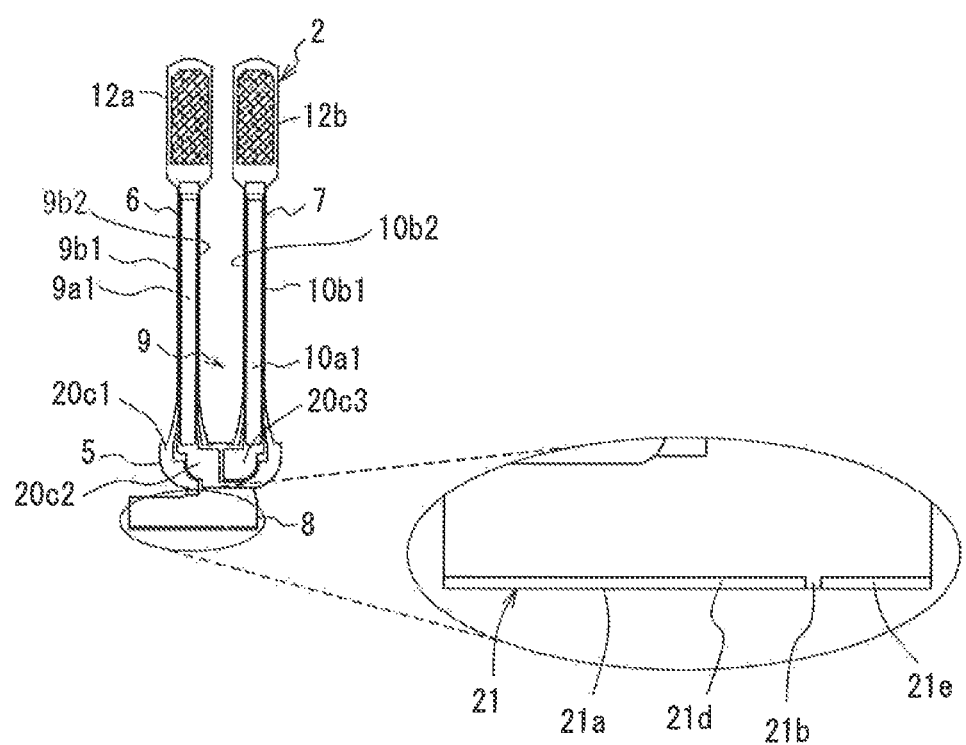
Figure 13B:
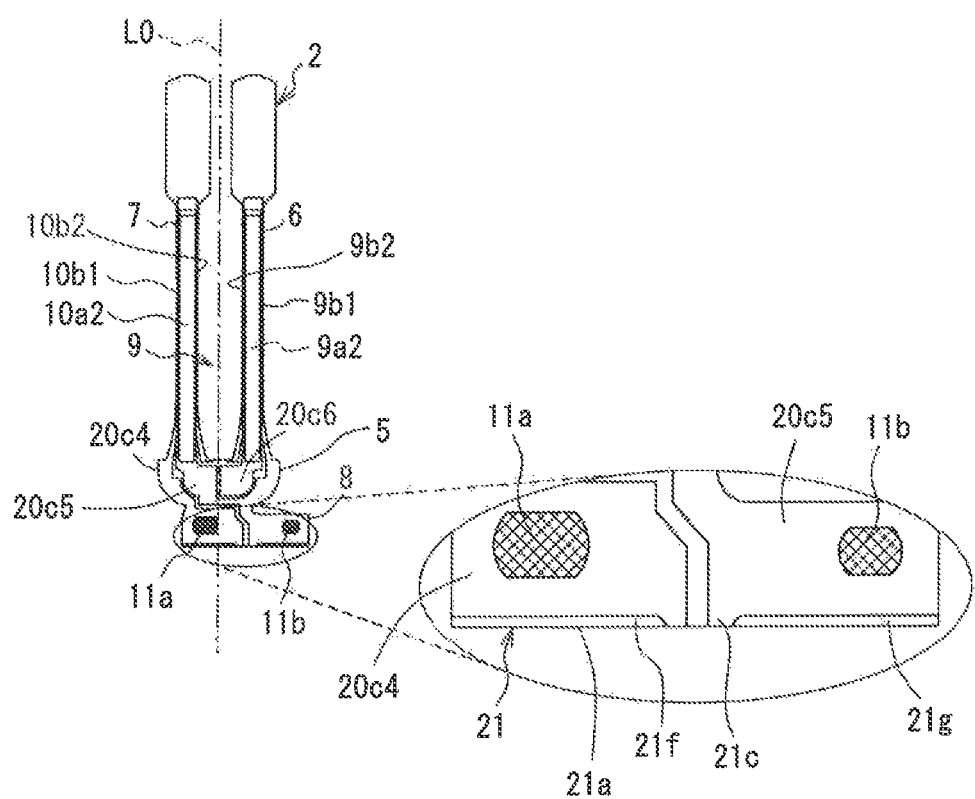
FIG. 13b is an enlarged back surface view of the crystal vibration piece separated from the frame portion of the crystal wafer illustrated in FIG. 11b.

In the crystal water 1 thus structurally characterized, the crystal vibration piece 2 is broken off at the break-off part 13 formed in the coupling portion 4 and separated from the frame portion 3 as illustrated in FIGS. 13a and 13b.

Referring to FIGS. 13a and 13b, the crystal vibration piece 2 has a break-off end part 21 on an end surface of the junction portion 8 as illustrated in an enlarged view of a circled portion. The break-off end part 21 is formed when the crystal vibration piece 2 is broken off and separated from the crystal vibration piece 2.

The break-off end part 21 has planar parts 21b and 21c and bent parts 21d to 21g respectively formed in a direction in which the crystal vibration piece 2 is broken off. In the planar parts 21b and 21c, the front and back surfaces of the crystal vibration piece 2 are continuous to a break-off end 21a of the break-off end part 21. In the bent parts 21d to 21g, the front and back surfaces of the crystal vibration piece 2 are bending.

In the planar part 21c of the planar parts 21b and 21c, the extraction electrodes 20c4 and 20c5 of the crystal vibration piece 2 are extracted as far as the break-off end 21a. The planar parts 21b and 21c are formed at positions displaced from each other in the direction in which the crystal vibration piece 2 is broken off.

The bent parts 21d to 21g may be U-shaped, V-shaped, obliquely shaped, or the like in cross section. The shapes of the bent parts 21d to 21g may depend on cross-sectional shapes of grooved slits 13a to 13d described later or which one of the grooved slits 13a to 13d is chosen as a position at which the crystal vibration piece 2 is broken off.

Since the grooved slits 13a to 13d described later are overlapping with one another in almost the entire thickness direction, the bent parts 21d to 21g are bending toward the front-surface side or the back-surface side to reduce in thickness.

Figure 14A:
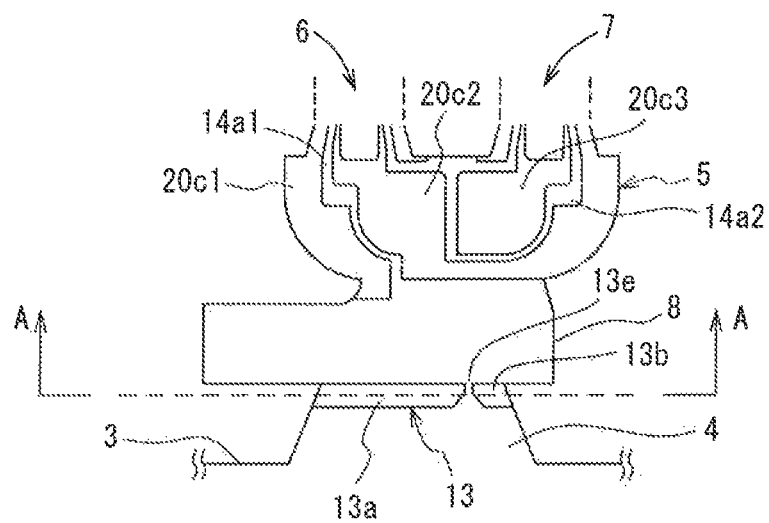
Figure 14B:
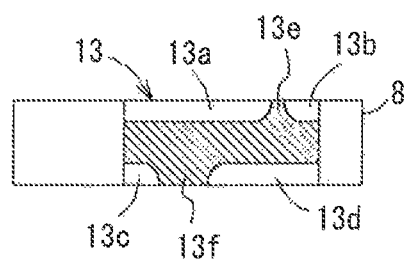
Figure 14C:
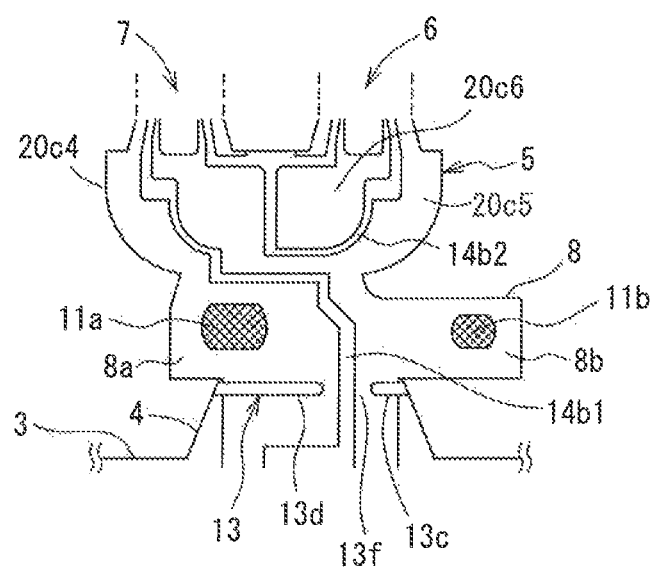
FIG. 14c is a partly enlarged back surface view of the crystal wafer illustrated in FIG. 12b.
Figure 15A:
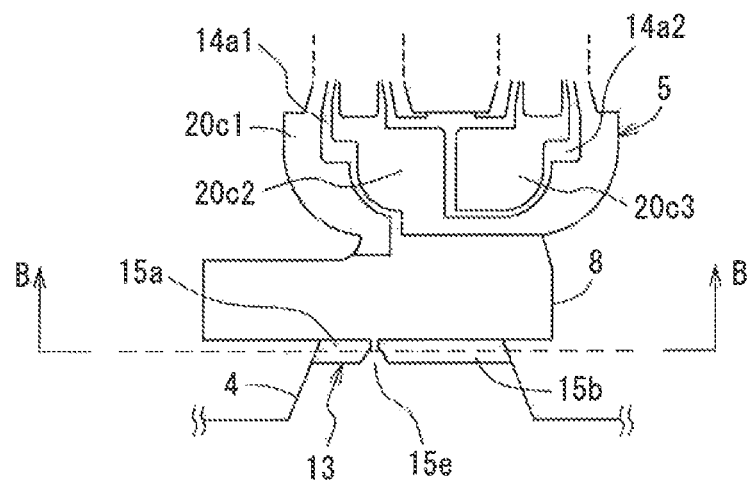
FIG. 15a is a partly enlarged front surface view of a crystal wafer having a break-off part according to a first modified example of the second embodiment illustrated in FIG. 10.
Figure 15B:
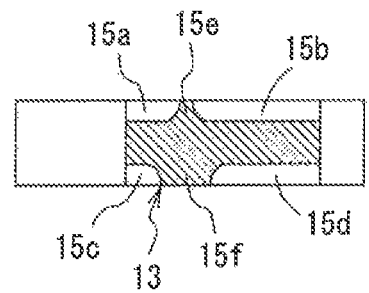
Figure 15C:
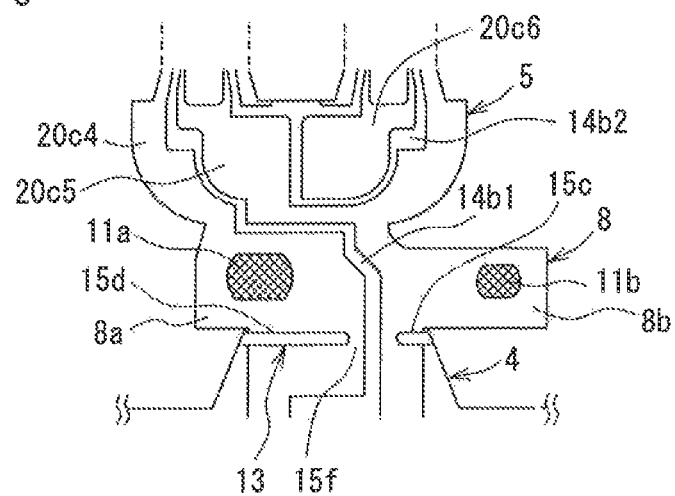
FIG. 15c is a partly enlarged back surface view of the crystal wafer according to the second embodiment illustrated in FIG. 10.

The break-off part 13 is described in detail referring to FIGS. 14a, 14b, and 14c. FIG. 14a is a partly enlarged front surface view of the crystal wafer 1. FIG. 14b is an A-A sectional view of FIG. 14a. FIG. 14c is a partly enlarged back surface view of the crystal wafer 1.

The break-off part 13 has, on its front-surface side, two grooved slits 13a and 13b extending along the width direction of the coupling portion 4. These grooved slits 13a and 13b are, however, not formed in a part of the coupling portion 4 in the width direction. This part of the coupling portion 4 in the width direction constitutes a bridge 13e.

The grooved slits 13a and 13b are formed by etching. The bridge 13e, which is an unetched part, has a flat surface. The grooved slits 13a and 13b formed by etching may have a V-shape, a U-shape, or the like in cross section.

The break-off part 13 has, on its back-surface side, two grooved slits 13c and 13d extending along the width direction of the coupling portion 4. These grooved slits 13c and 13d are, however, not formed in a part of the coupling portion 4 in the width direction. This part of the coupling portion 4 in the width direction constitutes a bridge 13f.

The grooved slits 13c and 13d are formed by etching. The bridge 13f, which is an unetched part, has a flat surface. The grooved slits 13c and 13d formed by etching may have a V-shape, a U-shape, or the like in cross section.

The bridge 13e on the front-surface side of the break-off part 13 is narrower in the width direction of the coupling portion 4 than the bridge 13f on the back-surface side. A distance in the width direction between the grooved slits 13a and 13b on the front-surface side is, therefore, shorter, making these grooved slits easily breakable.

The bridge 13f on the back-surface side does not overlap in the thickness direction with the bridge 13e on the front-surface side, and is formed at a position displaced from the bride 13e in the width direction. This makes it easier to break off the crystal vibration piece 2 at the break-off part 13 and separate it from the frame portion 3.

The bridge 13f on the back-surface side has a large dimension in the width direction, making it easier to form the extraction electrodes 20c4 and 20c5 by way of the bridge 13f on the back-surface side.

Of the extraction electrodes 20c1 to 20c6, the extraction electrodes 20c4 and 20c5 are connected to the first and second metal bumps 11a and 11b of the junction portion 8. These extraction electrodes, serving as a pair of electrodes for frequency adjustment, are also extracted from the coupling portion 4 to the frame portion 3 by way of the bridge 13f.

The extraction electrodes 20c4 and 20c5, which are intended for applying a voltage for frequency adjustment, are not formed in the grooved slits as in the prior art. These extraction electrodes are formed on a surface of the bridge 13f on the back-surface side of the break-off part 13 to prevent the occurrence of electrical short circuit and/or wire disconnection.

The fabrication of the crystal wafer 1 is described. First, a resist pattern is formed by photolithography. Then, the outer shape of this resist pattern is processed by wet etching to obtain the raw material of the crystal wafer 1 with its base material being exposed on its entire surface.

Next, an electrode film is formed by vapor deposition on the entire surface of this material. This electrode film formed on the entire surface is etched into required electrode patterns to fabricate the crystal wafer 1.

In connection with the formation of the driving electrodes 9b1 and 10b1 by etching on the side surfaces of the vibration arm portions 6 and 7, the electrode film may be left unetched on the side surfaces of the coupling portion. Assuming that the remaining electrode film is electrically short-circuited with respect to the electrode film left unremoved in the grooved slits 13a to 13d, the bridges 13e and 13f between the grooved slits 13a to 13d may effectively prevent electrical short circuit between the driving electrodes 9b1 and 10b1 on the side surfaces.

For frequency adjustments (coarse frequency adjustments) in the crystal wafer 1 performed before the crystal vibration piece 2 is broken off from the frame portion 3, the frequency of the crystal vibration piece 2 may be measurable by applying the voltage for frequency adjustment to the extraction electrodes 20c4 and 20c5 extracted to the frame portion 3 as the electrodes for frequency adjustment.

Based on the measured frequency, the frequency-adjusting electrode portions for weight 12a and 12b at the edge parts of the first and second vibration arm portions 6 and 7 may be decreased in mass by laser beam irradiation or increased in mass by partial vapor deposition for frequency adjustments of the crystal vibration piece 2.

When the frequency adjustments are over, the crystal vibration piece 2 is broken off at the break-off part 13 and separated from the frame portion 3. A suitable break-off means may be employed to separate the crystal vibration piece 2. For example, a break-off pin, not illustrated in the drawings, may be moved downward and pushed into the crystal vibration piece 2 to separate the crystal vibration piece 2 from the frame portion 3.

After the crystal vibration piece 2 is thus separated, the first and second metal bumps 11a and 11b are bonded to the electrode pads in the package not illustrated in the drawings and supported in the package in a cantilever manner. Finally, a crystal vibration device is obtained.

As described so far, the crystal wafer 1 is advantageous in that the crystal vibration piece 2 may be adjustable in frequency before the crystal vibration piece 2 is separated from the wafer.

The shape of the break-off part 13 is not necessarily limited to any one of the before-mentioned shapes and may be variously modified. Hereinafter, modified examples of the break-off part 13 are described referring to FIGS. 15 to 18.

Modified Examples of Break-Off Part

FIGS. 15 to 18 illustrate a first modified example of the break-off part 13.

A break-off part 13 according to the first modified example has, on its front-surface side, two grooved slits 15a and 15b, and a bridge 15e between the grooved slits 15a and 15b. This break-off part 13 according to the first modified example further has, on its back-surface side, two grooved slits 15c and 15d, and a bridge 15f between the grooved slits 15c and 15d.

The first modified example presents a structure in which the bridge 15f on the back-surface side and the bridge 15e on the front-surface side are overlapping with each other in the thickness direction of the break-off part 13.

According to the first modified example, the extraction electrodes 20c4 and 20c5, serving as the electrodes for frequency adjustment, are extracted to the frame portion 3 by way of the bridge 15f.

Figure 16A:
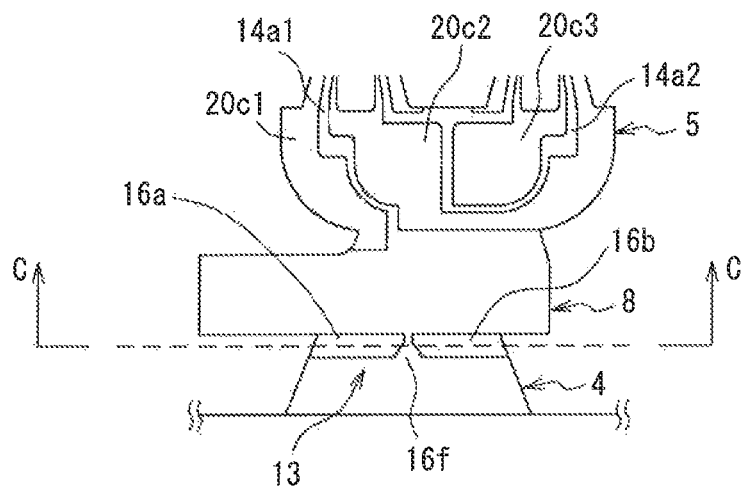
FIG. 16a is a partly enlarged front surface view of a crystal wafer having a break-off part according to a second modified example of the second embodiment.
Figure 16B:
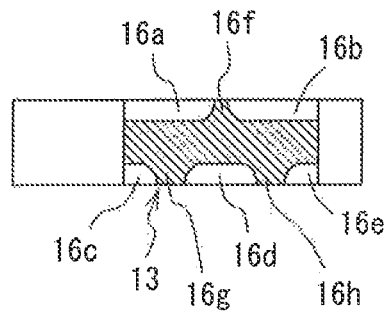
Figure 16C:
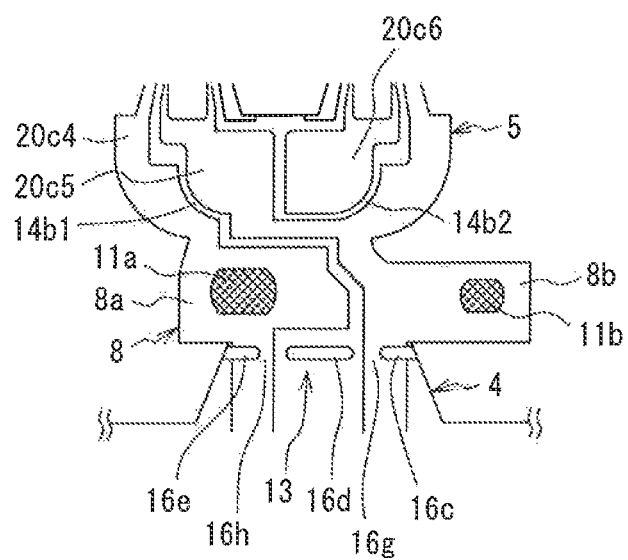
FIG. 16c is a partly enlarged back surface view of the crystal wafer according to the second embodiment illustrated in FIG. 10.

FIGS. 16a to 16c illustrate a second modified example of the break-off part 13.

A break-off part 13 according to the second modified example has, on its front-surface side, two grooved slits 16a and 16b, and a bridge 16f between the grooved slits 16a and 16b. The break-off part 13 according to the second modified example further has, on its back-surface side, three grooved slits 16c to 16e, and two bridges 16g and 16h among the grooved slits 16c to 16e.

The second modified example presents a structure in which the bridges 16f, 16g, and 16h on the front and back surfaces are not overlapping with one another in the thickness direction of the break-off part 13.

According to the second modified example, the extraction electrodes 20c4 and 20c5, serving as the electrodes for frequency adjustment, are extracted to the frame portion 3 by way of the bridges 16h and 16g.

Figure 17A:
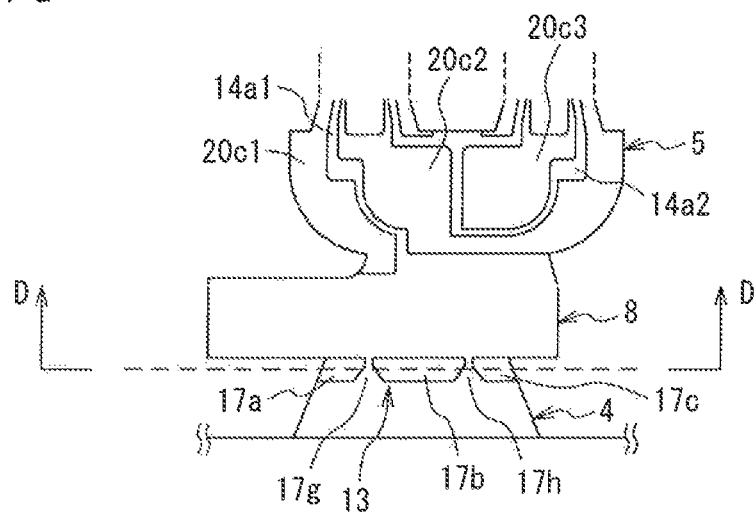
FIG. 17a is a partly enlarged front surface view of a crystal wafer having a break-off part according to a third modified example of the second embodiment.
Figure 17B:
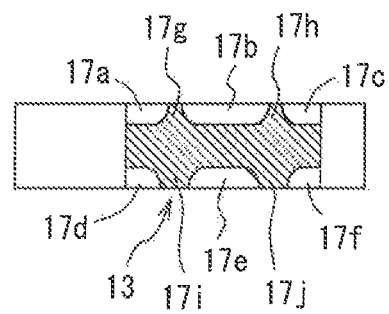
Figure 17C:
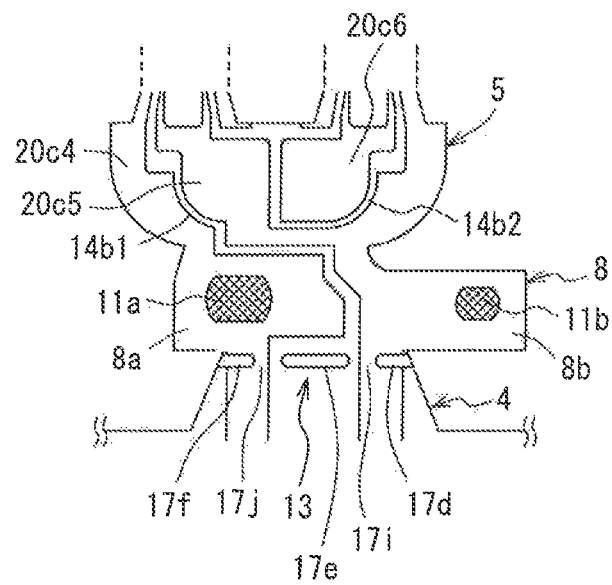
FIG. 17c is a partly enlarged back surface view of the crystal wafer according to the second embodiment illustrated in FIG. 10.

FIGS. 17a to 17c illustrate a third modified example of the break-off part 13.

A break-off part 13 according to the third modified example has, on its front-surface side, three grooved slits 17a to 17c, and two bridges 17g and 17h among the grooved slits 17a to 17c. The break-off part 13 according to the third modified example further has, on its back-surface side, three grooved slits 17d to 17f, and two bridges 17i and 17j among the grooved slits 17d to 17f.

The third modified example presents a structure in which the bridges on the front and back surfaces are overlapping with one another in the thickness direction of the break-off part 13. According to the third modified example, the extraction electrodes 20c4 and 20c5, serving as the electrodes for frequency adjustment, are extracted to the frame portion 3 by way of the bridges 17i and 17j.

FIGS. 18a to 18c illustrate a fourth modified example of the break-off part 13.

A break-off part 13 according to the fourth modified example has, on its front-surface side, two grooved slits 18a and 18b, and a bridge 18e between the grooved slits 18a and 18b. This break-off part further has, on its back-surface side, two grooved slits 18c and 18d and a bridge 18f between the grooved slits 18c and 18d.

According to this modified example, extraction electrodes 20c7, 20c8, and 20c9 are formed on the front surface of the junction portion 8, and extraction electrodes 20c10, 20c11, and 20c12 are formed on the back surface of the junction 8 portion. The reference signs 14a1, 14a2, 14b1, and 14b2 represent discrete insulation lines between the extraction electrodes.

The extraction electrodes 20c10 and 20c11 are connected to the first and second metal bumps 11a and 11b on the back-surface side of the junction portion 8, respectively. The extraction electrode 20c9 on the front-surface side of the junction portion 8 is extracted to the frame portion 3 by way of the bridge 18e. The extraction electrode 21c11 on the front-surface side of the junction portion 8 is extracted to the frame portion 3 by way of the bridge 18f. These extraction electrodes act as the electrodes for frequency adjustment.

Third Embodiment

A tuning-fork type crystal vibration piece according to a third embodiment of the invention is separated from a crystal wafer similar to the one according to the first embodiment. Other than the technical features provided to prevent electrostatic destruction described later, the tuning-fork type crystal vibration piece according to the third embodiment is essentially configured structurally and technically like the tuning-fork type crystal vibration piece of the crystal wafer according to the first embodiment.

The third embodiment provides a tuning-fork type crystal vibration piece advantageous in that the extraction electrodes, which extract the driving electrodes of the paired arm portions on the base portion, may be prevented from being electrostatically destroyed on the base portion.

The tuning fork-type crystal vibration piece is mounted in the package of a crystal vibration device as a crystal vibration unit. Such a crystal vibration device is further miniaturized in recent years. With this trend, the base portion of a crystal vibration piece mounted in the crystal vibration device is increasingly reduced in area dimension.

With the base portion smaller in area dimension, it is necessary to form the extraction electrodes on the base portion in a shorter width with a shorter interval therebetween. When the extraction electrodes are thinned and more closely spaced from each other on the base portion, however, electric discharge is likely to be triggered by current concentration at angular parts between the electrodes. The electric discharge may pose the risk of electrostatic destruction of the extraction electrodes.

The third embodiment, therefore, seeks to prevent electrostatic destruction of the extraction electrodes, thereby allowing the tuning-fork type crystal vibration piece to maintain required vibration characteristics.

To this end, a tuning-fork type crystal vibration piece according to an aspect of the third embodiment is characterized in that base portion extraction electrodes are formed on the base portion. The base portion extraction electrodes include a base portion extraction electrode for connection by which the driving electrodes are partly common-connected, and a pair of base portion extraction electrodes for external use by which the driving electrodes are partly externally extracted. The base portion extraction electrodes are greater in thickness than the driving electrodes formed on the front and back main surfaces of the vibration arm portions.

According to this aspect, the base portion extraction electrodes on the base portion are greater in thickness than the driving electrodes formed on the front and back main surfaces of the vibration arm portions. The base portion extraction electrodes increased in thickness are improved in mechanical strength. While the base portion may be increasingly narrowed, and the base portion extraction electrodes may be accordingly reduced in width and narrowly spaced from each other, the base portion extraction electrodes thus improved in mechanical strength may be less likely to be electrostatically destroyed by electric discharge. As a result, the vibration characteristics of the crystal vibration piece may continue to be stable over a long period of time.

A tuning-fork type crystal vibration piece according to another aspect of the third embodiment is characterized in that edge-of-arm extraction electrodes by which the driving electrodes are partly common-connected are formed on edge sides of the vibration arm portions. The edge-of-arm extraction electrodes are greater in thickness than the driving electrodes, and the base portion extraction electrodes are at least substantially equal in thickness to the edge-of-arm extraction electrodes.

Conventionally, the base portion extraction electrodes are thinly formed like the driving electrodes. On the other hand, surface layers of the edge-of-arm extraction electrodes are plated with a metal for frequency adjustments of the crystal vibration piece. This aspect, by leveraging the step of metal-plating the edge-of-arm extraction electrodes, may increase the base portion extraction electrodes in thickness than the driving electrodes without cost increase for thickening the base portion extraction electrodes.

A tuning-fork type crystal vibration piece according to yet another aspect of the third embodiment further includes a junction portion protruding from the other end surface of the base portion. This junction portion includes a basal end part and an extended part. The basal end part is protruding from a central line on the other end surface of the base portion between positions at which the paired vibration arm portions are juxtaposed. The extended part is extending from the basal end part toward one side in the arm-juxtaposed direction. This junction portion, with these parts thus arranged, has an L-like shape in plan view. On a surface of the basal end part is formed a first junction extraction electrode for external use to which one of the paired base portion extraction electrodes for external use is extracted. A first metal bump is formed in an upper part of the first junction extraction electrode for external use. On a surface of the extended part is formed a second junction extraction electrode for external use to which the other one of the paired base portion extraction electrodes for external use is extracted. A second metal bump is formed in an upper part of the second junction extraction electrode for external use. The first metal bump is greater in size in plan view than the second metal bump.

A crystal vibration unit is given as an example, in which the crystal vibration piece is supported with the metal bumps in a cantilever manner in the package, and the junction portion has an L-like shape in plan view. According to this aspect wherein the first metal bump is greater in size in plan view than the second metal bump, and the first metal bump is formed at the basal end part of the coupling portion, the crystal vibration piece may maintain generally well-balanced vibrations despite the base portion extraction electrodes greater in thickness than the driving electrodes on the base portion.

A tuning-fork type crystal vibration piece according to yet another aspect of the third embodiment is characterized in that the edge-of-arm extraction electrodes have surface layers plated with a metal, metal bumps are formed in upper parts of the base portion extraction electrodes for external use or upper parts of the junction extraction electrodes for external use, and the metal bumps have surface layers plated with the same metal as the plating metal of the edge-of-arm extraction electrodes.

The frequency-adjusting electrode portion for weight may be formed by metal plating on the surface layers of the edge-of-arm extraction electrodes. According to this aspect wherein the surface layers of the metal bumps are plated with the same metal as the plating metal of the edge-of-arm extraction electrodes, the surface layers of the metal bumps may be metal-plated in the step of forming the frequency-adjusting electrode portion for weight. Thus, the metal bumps may be more thickened than the driving electrodes simultaneously with the formation of the frequency-adjusting electrode portion for weight without cost increase for thickening the metal bumps.

A tuning-fork type crystal vibration piece according to yet another aspect of the third embodiment is characterized in that the base portion has both side parts symmetrically and equally shaped in plan view relative to the central line between positions at which the paired vibration arm portions are juxtaposed, and the base portion extraction electrodes are electrically insulated from each other and formed in an equal thickness on substantially the whole front and back surfaces of the base portion.

According to this aspect, the base portion extraction electrodes, if increased in thickness, may not adversely affect long-term, well-balanced vibrations of the crystal vibration piece. As a result, a piezoelectric vibration piece may be obtainable that maintain required performance characteristics over a long period of time.

Figure 19:
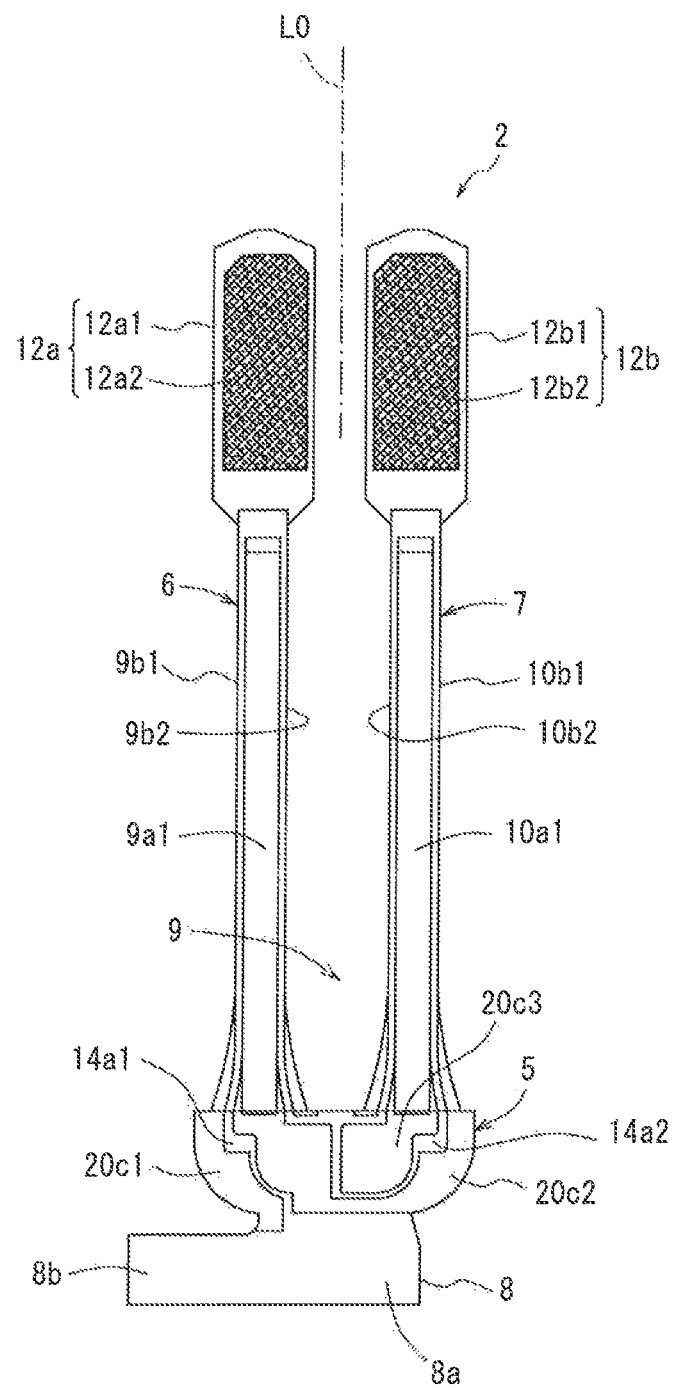
FIG. 19 is a front surface view of a tuning-fork type crystal vibration piece according to a third embodiment of the invention.
Figure 20:
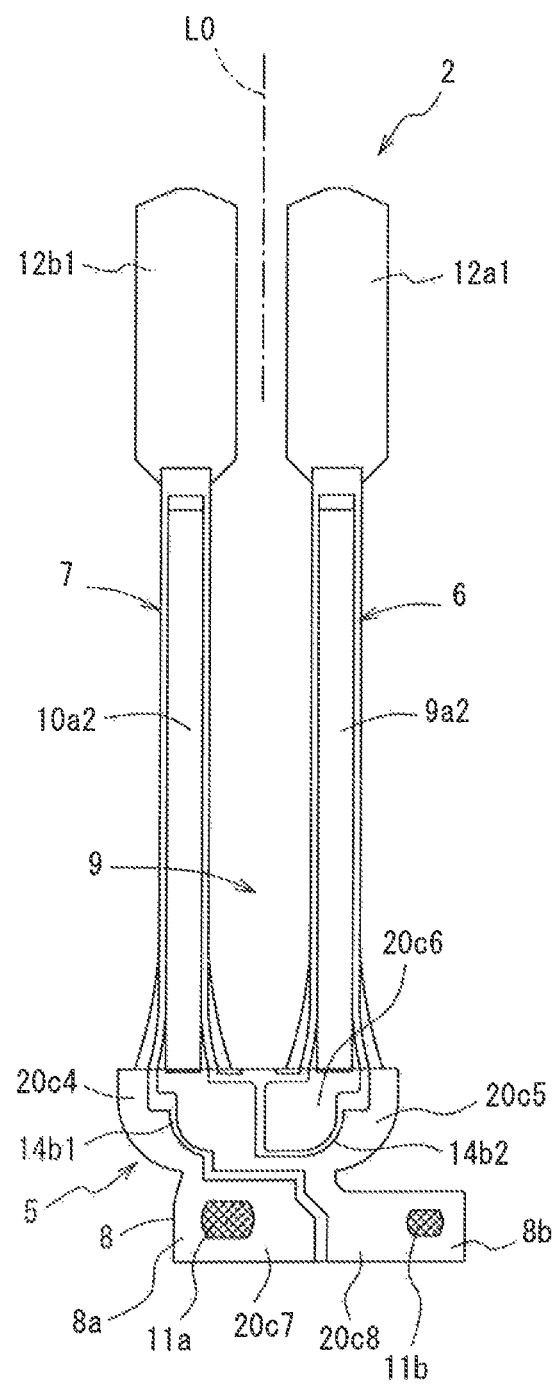
FIG. 20 is a back surface view of the tuning-fork type crystal vibration piece according to the third embodiment.
Figure 21:
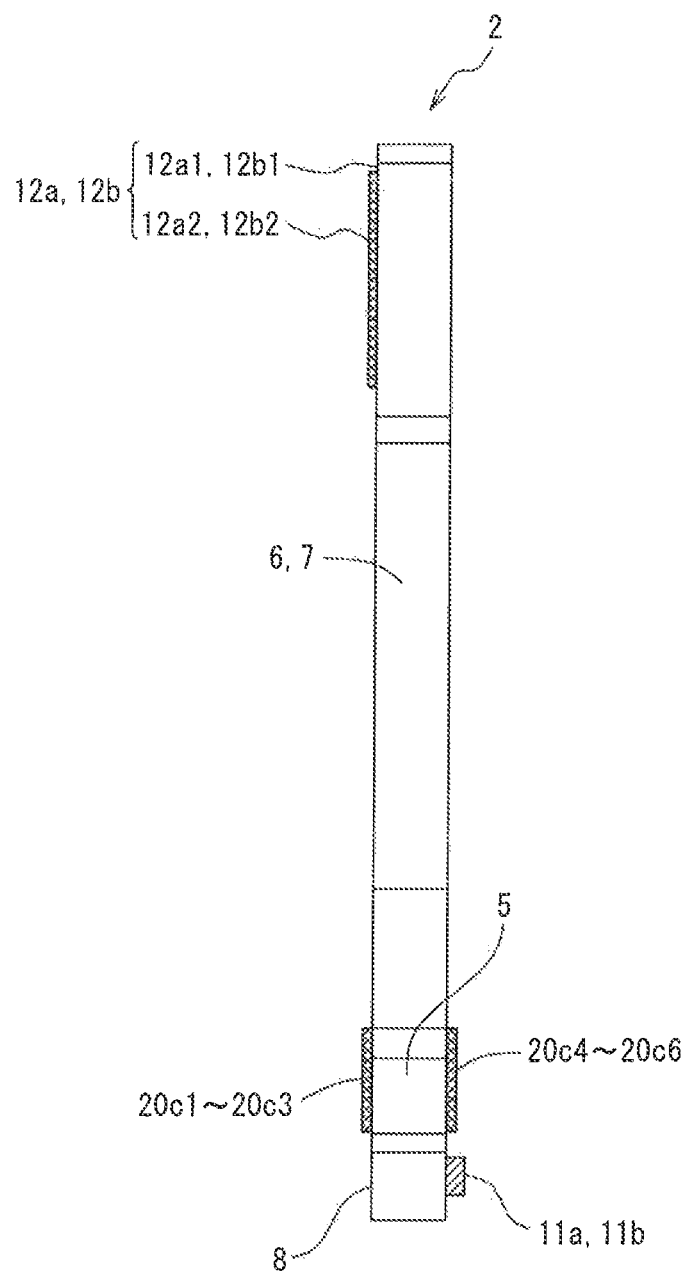
FIG. 21 is a side surface view of the tuning-fork type crystal vibration piece according to the third embodiment.

The third embodiment is hereinafter described in detail referring to FIGS. 19 to 21. FIG. 19 is a front surface view of the tuning-fork type crystal vibration piece according to the third embodiment. FIG. 20 is a back surface view of the tuning-fork type crystal vibration piece. FIG. 21 is a side surface view of the tuning-fork type crystal vibration piece. In these drawings, the same or similar structural elements are illustrated with the same reference signs, and detailed description of such structural elements may be omitted to avoid redundancy.

A crystal vibration piece 2 illustrated in these drawings is described below. A base portion extraction electrode for external use 20c4 is extracted to the back surface of the basal end part 8a of the junction portion 8 to form a first junction extraction electrode for external use 20c7. A first metal bump 11a elliptical in plan view is formed in an upper part of the first junction extraction electrode for external use 20c7. A base portion extraction electrode for external use 20c5 is extracted to the back surface of the extended part 8b of the junction portion 8 to form a second junction extraction electrode for external use 20c8. A second metal bump 11b elliptical in plan view is formed in an upper part of the second junction extraction electrode for external use 20c8. The shapes of first and second metal bumps 11a and 1b, instead of elliptical in plan view, may be circular in plan view.

Similarly to the first embodiment, the first metal bump 11a is formed on the basal end part 8a at a position substantially at the center in the direction in which the first and second vibration arm portions 6 and 7 are juxtaposed. Specifically, the first metal bump 11a is formed at a position slightly displaced from the central position toward one side in the arm-juxtaposed direction. The second metal bump 11b is formed on the extended part 8b at a position slightly displaced from the central position toward the other side in the arm-juxtaposed direction. The first metal bump 11a is greater in size in plan view than the second metal bump 11b. As a result, the crystal vibration piece 2 may maintain generally well-balanced vibrations.

On edge sides of the first and second vibration arm portions 6 and 7 are formed edge-of-arm extraction electrodes 12a and 12b by which the driving electrodes are partly common-connected.

The edge-of-arm extraction electrodes 12a and 12b include lower edge-of-arm extraction electrode portions 12a1 and 12b1, and frequency-adjusting electrode portions for weight 12a2 and 12b2 formed in a partial region on surfaces of the lower edge-of-arm extraction electrode portions 12a1 and 12b1. These edge-of-arm extraction electrodes 12a and 12b are greater in thickness in its entirety than the driving electrodes.

The lower edge-of-arm extraction electrode portions 12a1 and 12b1 are formed on front and back surfaces of the first and second vibration arm portions 6 and 7. The frequency-adjusting electrode portions for weight 12a2 and 12b2 are formed in a partial region of the lower edge-of-arm extraction electrode portions 12a1 and 12b1 on the surfaces of the first and second vibration arm portions 6 and 7.

The base portion extraction electrodes 20c1 to 20c6 are substantially equal in thickness to the edge-of-arm extraction electrodes 12a and 12b. The frequency-adjusting electrode portions for weight 12a2 and 12b2 are formed of a metal film by plating in a partial region of the lower edge-of-arm extraction electrode portions 12a1 and 12b1.

In the edge-of-arm extraction electrodes 12a and 12b according to the third embodiment, the lower edge-of-arm extraction electrode portions 12a1 and 12b1 are decreased in thickness, and the frequency-adjusting electrode portions for weight 12a2 and 12b2 are increased in thickness. Instead, the lower edge-of-arm extraction electrode portions 12a1 and 12b1 may be increased in thickness, while the frequency-adjusting electrode portions for weight 12a2 and 12b2 may be decreased in thickness. The lower edge-of-arm extraction electrode portions 12a1 and 12b1 and the frequency-adjusting electrode portions for weight 12a2 and 12b2 may be both increased in thickness in so far as these electrode portions are, on the whole, substantially equal in thickness to the base portion extraction electrodes 20c1 to 20c6. Alternatively, the edge-of-arm extraction electrodes 12a and 12b may be formed in a substantially equal thickness to the driving electrodes, while the frequency-adjusting electrode portions for weight 12a2 and 12b2 alone may be increased in thickness.

According to the third embodiment, the frequency-adjusting electrode portions for weight 12a2 and 12b2 are formed on the front-surface sides of the first and second vibration arm portions 6 and 7, however, may be formed on their back-surface sides.

To drive the crystal vibration piece 2 and enable its frequency to reach a required frequency, the frequency-adjusting electrode portions for weight 12a2 and 12b2 of the edge-of-arm extraction electrodes 12a and 12b are decreased in mass by laser beam scan or ion etching for fine frequency adjustments. Optionally, the lower edge-of-arm extraction electrode portions 12a1 and 12b1 may in increased in thickness for fine frequency adjustments, including the frequency-adjusting electrode portions for weight 12a2 and 12b2.

To effectively prevent electric discharge-induced electrostatic destruction, it should be understood that the base portion extraction electrodes 20c1 to 20c6 may be greater than or equal in thickness to the edge-of-arm extraction electrodes 12a and 12b.

In the crystal vibration piece 2 according to the third embodiment thus characterized, the base portion extraction electrodes 20c1 to 20c6 on the base portion 5 are at least substantially equal in thickness to the edge-of-arm extraction electrodes 12a and 12b as illustrated in FIG. 21. The base portion extraction electrodes 20c1 to 20c6, on the other hand, are greater in thickness than the driving electrodes 9b1, 9b2, 10b1, and 10b2 on the front and back main surfaces of the vibration arm portions 6 and 7. The base portion extraction electrodes 20c1 to 20c6 are formed in an equal thickness on almost the whole front and back surfaces of the base portion 5 except for the discrete insulation lines 14a1, 14a2, 14b1, and 14b2.

According to the third embodiment, the base portion extraction electrodes 20c1 to 20c6 on the base portion 5 are greater in thickness than the driving electrodes 9b1, 9b2, 10b1, and 10b2 on the front and back main surfaces of the vibration arm portions 6 and 7. The base portion extraction electrodes 20c1 to 20c6 thus thickened may be enhanced in mechanical strength.

The base portion extraction electrodes 20c1 to 20c6 may be formed in a smaller width on the base portion 5 and shortly spaced from one another with the discrete insulation lines 14a1, 14a2, 14b1, and 14b2 interposed therebetween. In the event of electric discharge at angular parts, however, the base portion extraction electrodes 20c1 to 20c6 thus enhanced in mechanical strength may be effectively prevented from undergoing electrostatic destruction.

According to the third embodiment, while the junction portion 8 has an L-like shape in plan view, the first metal bump 11a is greater in size in plan view than the second metal bump 11b, and the first metal bump 11a is formed substantially on the central line between the positions at which the paired first and second vibration arm portions 6 and 7 are juxtaposed. These structural advantages may allow the whole crystal vibration piece 2 to achieve generally well-balanced vibrations.

The third embodiment is further characterized in that the base portion 5 has both side parts symmetrical in plan view relative to the central line between the positions at which the paired first and second vibration arm portions 6a and 7 are juxtaposed, and the base portion extraction electrodes 20c1 to 20c6 are formed in a substantially equal thickness on almost the whole front and back surfaces of the base portion 5. Therefore, while the base portion extraction electrodes 20c1 to 20c6 are increased in thickness to prevent electrostatic destruction, the crystal vibration piece 2 may keep well-balanced vibrations and achieve stable and long-term performance characteristics.

In the edge-of-arm extraction electrodes 12a and 12b, the lower edge-of-arm extraction electrode portions 12a1 and 12b1 may be thin films each having a chrome (Cr) under layer and a gold (Au) upper layer formed by photolithography. Further, the frequency-adjusting electrode portions for weight 12a2 and 12b2 may be thick films coated with gold (AU) by electrolytic plating and increased in mass for frequency adjustments.

A process for thickening the extraction electrodes 20c1 to 20c6 is hereinafter described.

The outer shapes of the crystal vibration pieces 2 are formed by processing a crystal wafer using photolithography, and necessary electrodes are formed on the crystal vibration pieces 2. Then, the crystal vibration pieces 2 are broken off and separated from the crystal wafer into individual pieces.

The electrodes of the vibration arm portions 6 and 7 of the crystal vibration piece 2 specifically have a thin-layered structure having a Cr under layer and an Au upper layer. The frequency-adjusting electrode portions for weight 12a2 and 12b2 in a partial region of the lower edge-of-arm extraction electrode portions 12a1 and 12b1 of the edge-of-arm extraction electrodes 12a and 12b are formed as thick films by electrolytic plating (Au). The metal bumps 11a and 11b on the junction portion 8 are also formed as thick films by electrolytic plating (Au).

After the base portion extraction electrodes 20c1 to 20c6 are formed on the base portion 5 in the same thin-film structure as the driving electrodes, the base portion extraction electrodes 20c1 to 20c6 have their surface layers be plated by electrolytic plating in the step of forming the frequency-adjusting electrode portions for weight 12a2 and 12b2 in the upper parts of the lower edge-of-arm extraction electrode portions 12a1 and 12b1 of the edge-of-arm extraction electrodes 12a and 12b. The base portion extraction electrodes 20c1 to 20c6 thus metal-plated are substantially equal in thickness to the edge-of-arm extraction electrodes 12a and 12b.

The edge-of-arm extraction electrode 12a is connected to the driving electrodes 9b1 and 9b2 on the side surfaces of the first vibration arm portion 6. The edge-of-arm extraction electrode 12b is connected to the driving electrodes 10b1 and 10b2 on the side surfaces of the second vibration arm portion 7.

The frequency-adjusting electrode portions for weight 12a2 and 12b2 of the edge-of-arm extraction electrodes 12a and 12b may be formed in an approximately few-μm thickness, or preferably in an approximately 2 to 8 μm thickness. The first and second metal bumps 11a and 11b may be formed in an approximately few-μm thickness, or preferably in an approximately 7 to 15 μm thickness.

In this instance, the base portion extraction electrodes 20c1 to 20c on the base portion 5 before plating are thin films substantially equal in thickness to the driving electrodes. Preferably, the base portion extraction electrodes 20c1 to 20c may be thickened to be substantially equal in thickness to the edge-of-arm extraction electrodes 12a and 12b in the electrolyte plating step for the frequency-adjusting electrode portions for weight 12a2 and 12b2.

According to the third embodiment, the base portion extraction electrodes 20c1 to 20c6 are greater in thickness than the driving electrodes and thereby enhanced in mechanical strength. While the base portion 5 may be reduced in area, and the widths and inter-electrode distances of the base portion extraction electrodes 20c1 to 20c6 may be accordingly reduced, the base portion extraction electrodes 20c1 to 20c6 on the base portion 5 may still be prevented from being electrostatically destroyed by electric discharge, if occurred among these base portion extraction electrodes.

In a crystal vibration unit (piezoelectric vibrator) wherein the crystal vibration piece 2 is supported in the package in a cantilever manner on the base-portion-5 side, the crystal vibration piece 2 may be supported with a greater strength by increasing in thickness the base portion extraction electrodes 20c1 to 20c6 on the base portion 5, and the vibrations of the vibration arm portions 6 and 7 may be effectively stabilized.

As thus far described, the third embodiment may be advantageous in that the base portion extraction electrodes 20c1 to 20c6 on the front and back surfaces of the base portion 5 are greater in thickness than the driving electrodes 9a1, 9b1, 10b1, and 10b2 on the front and back surfaces of the base portion 5 and thereby enhanced in mechanical strength. This may avoid that electric discharge, if occurred among the base portion extraction electrodes 20c1 to 20c6 on the base portion 5, leads to electrostatic destruction of the base portion extraction electrodes 20c1 to 20c6.

According to the third embodiment, the first and second metal bumps 11a and 11b are formed on the first and second junction extraction electrodes for external use 20c7 and 20c8 of the junction portion 8. Optionally, the junction portion 8 may be omitted, and the first and second metal bumps 11a and 11b may be respectively formed in upper parts of the base portion extraction electrodes 20c4 and 20c5.

Fourth Embodiment

Tuning-fork type crystal vibration pieces are used in a broad range of applications as a frequency source of reference signals in, for example, clocks and/or watches. Such a tuning-fork type crystal vibration piece has a pair of vibration arm portions juxtaposed in parallel to each other on one-end side of a base portion. The vibration arm portions are designed to vibrate in bending motions, and any vibration leakages may be fraught with inferior vibration characteristics including poor vibration efficiency and equivalent series resistance, and vibration frequency drift.

An example of the vibration leakages may be a vibration leakage to an end surface of the base portion opposite to the other end surface thereof. It may be contemplated to provide a protrusion on the end surface so as to reduce the vibration leakages directed to the end surface.

With accelerated miniaturization of crystal vibration pieces these days, an interval between one end side and the other end side of the base portion may be increasingly narrower. This may provoke an increase of vibration energy transmitted from the vibration arm portions to the other end surface of the base portion, unfavorably augmenting the vibration leakages. Providing a protrusion on the end surface alone may no longer be an effective solution for the vibration leakages.

A fourth embodiment of the invention provides for a tuning-fork type crystal vibration piece that may diminish the vibration leakages.

A tuning-fork type crystal vibration piece according to an aspect of the fourth embodiment has a pair of vibration arm portions juxtaposed on one end side thereof and protruding in parallel to each other from the one end side, and a step portion formed in a part of an end surface on the other end side opposite to the one side, the step portion including a first protrusion and a second protrusion formed on the first protrusion.

According to this aspect, vibration leakages fraught with vibrations of the pair of vibration arm portions, which are transmitted from one end side to an end surface on the other end side, may be diminished by the first protrusion of the step portion and then further diminished by the second protrusion. As compared to a tuning-fork type crystal vibration piece with a flattened end surface on the other end side or a tuning-fork type crystal vibration piece with a single protrusion formed on the end surface, vibration leakages may be more effectively diminished.

The tuning-fork type crystal vibration piece further has, on the end surface on the other side, a base portion with the pair of vibration arm portions formed on one end surface thereof. In an exemplified structure wherein first and second metal bumps are formed in the base portion in a direction in which the paired vibration arm portions are juxtaposed, the other end surface of the base portion corresponds to the end surface on the other end side. In an exemplified structure wherein a junction portion is formed on the other end surface of the base portion opposite to the one end surface, an end surface of the junction portion corresponds to the end surface on the other end side, and the step portion is formed on the end surface of the junction portion.

A tuning-fork type crystal vibration piece according to another aspect of the fourth embodiment has a base portion with a pair of vibration arm portions formed on one end surface thereof, and a junction portion formed on the other end surface of the base portion opposite to the one end surface. The junction portion has a basal end part and an extended part. The basal end part has a first metal bump and is protruding toward the other end surface of the base portion from a region including a central line between positions at which the paired vibration arm portions are juxtaposed. The extended part has a second metal bump and is protruding from the base portion toward one side in the arm-juxtaposed direction. The junction portion, with these parts thus arranged, has an L-like shape in plan view. An end surface of the junction portion is located on the other end side, and a step portion is formed on the end surface of the junction portion.

According to this aspect, the junction portion formed on the other end side of the base portion has an L-like shape in plan view. This may extend a travelling distance of the vibration leakages from one end side to the end surface on the other end side, consequently more effectively diminishing the vibration leakages.

According to yet another aspect of the fourth embodiment, the first protrusion is formed in a width across a center line between positions at which the vibration arm portions are juxtaposed.

As the paired vibration arm portions vibrate on one end side of the base portion, vibrations are substantially equally transmitted from one end side of the base portion to the end surface on the other end side of the base portion. According to this aspect, the first protrusion formed in a width across the center line between positions at which the vibration arm portions are juxtaposed may equally diminish the transmitted vibration leakages, and the second protrusion, when further diminishing the vibration leakages, may also diminish mutual interference between the vibration leakage brought by one of the vibration arm portions and the vibration leakage brought by the other. This structural advantage may more effectively diminish the vibration leakages.

According to yet another aspect of the fourth embodiment, side surfaces of the first protrusion on both ends in a width direction thereof are rising substantially perpendicularly along the protruding direction from the other end surface of the base portion or the end surface of the junction portion, front and back surfaces of the first protrusion are flat and continuous to the other end surface of the base portion or front and back surfaces of the junction portion, the second protrusion is smaller in width than the first protrusion, and the second protrusion has, on both sides in a width direction thereof, regions progressively thinner toward the both ends of the first protrusion in the width direction.

According to this aspect, the side surfaces on both sides of the first protrusion in the width direction are rising perpendicularly along the protruding direction from the other end surface of the base portion or the end surface of the junction portion, and the front and back surfaces of the first protrusion are flat and continuous to the other end surface of the base portion or front and back surfaces of the junction portion. Then, the vibration leakages from the vibration arm portions to the other end surface of the base portion or to the end surface of the junction portion may be greatly diminished by the first protrusion. Then, the vibration leakages may finally be even further diminished by the second protrusion as the vibration leakages travel through the regions progressively thinner toward both ends of the first protrusion in the width direction. This may minimize the vibration leakages, effectively diminishing any adverse influences on the vibration characteristics.

According to yet another aspect of the fourth embodiment, both ends of the second protrusion in the width direction are distantly spaced from the first and second metal bumps with no overlap with these bumps in a direction perpendicular to the width direction.

According to this aspect, any cracks near the end surface on the other end side may be prevented from further spreading around the two metal bumps under an external force such as an impact load. This may prevent vibration frequency drift when such an external force is imposed on the crystal vibration piece.

According to yet another aspect of the fourth embodiment, the second protrusion is formed at a position displaced from the center between positions at which the paired vibration arm portions are juxtaposed toward one side in the arm-juxtaposed direction.

According to this aspect wherein the second protrusion is formed at a position displaced toward one side in the arm-juxtaposed direction, mutual interference between the vibration leakages from both sides on the other end side may be effectively neutralized. This may more effectively suppress the vibration leakages transmitted from both sides on the other end side.

According to yet another aspect of the fourth embodiment, a top portion and a bottom portion of the second protrusion have flat surfaces continuous to the front and back surfaces of the junction portion.

This aspect may more effectively diminish the vibration leakages transmitted to the second protrusion.

The fourth embodiment is hereinafter described referring to FIG. 22a to FIG. 25.

Figure 22A:
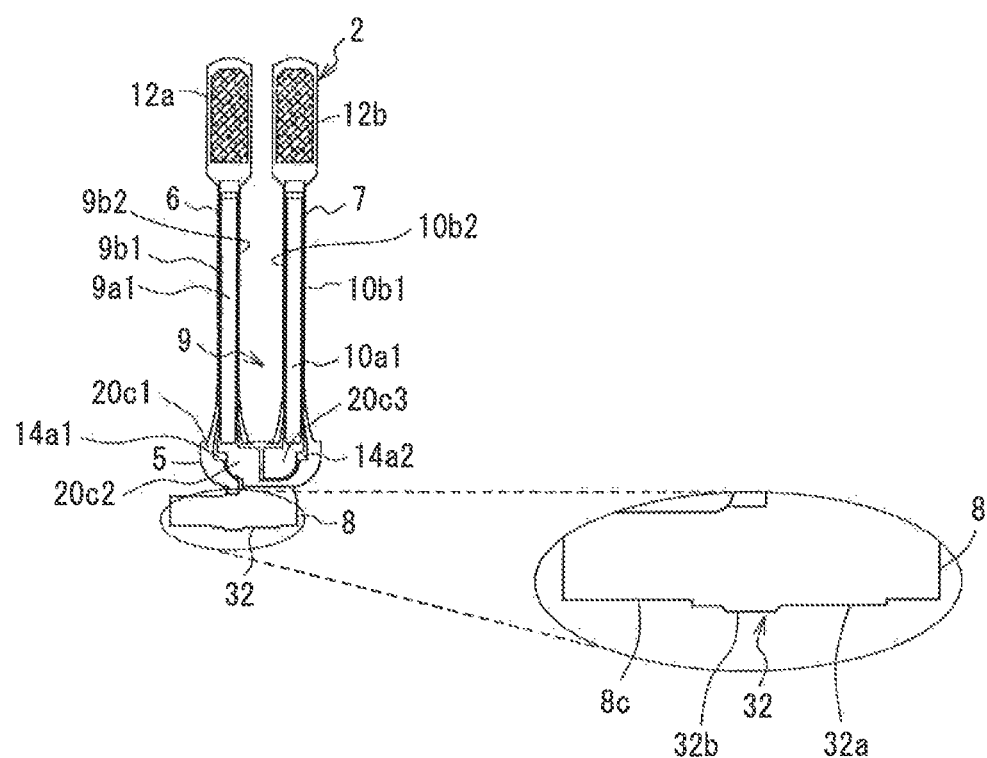
FIG. 22a is a front surface view of a crystal vibration piece according to a fourth embodiment of the invention.
Figure 22B:
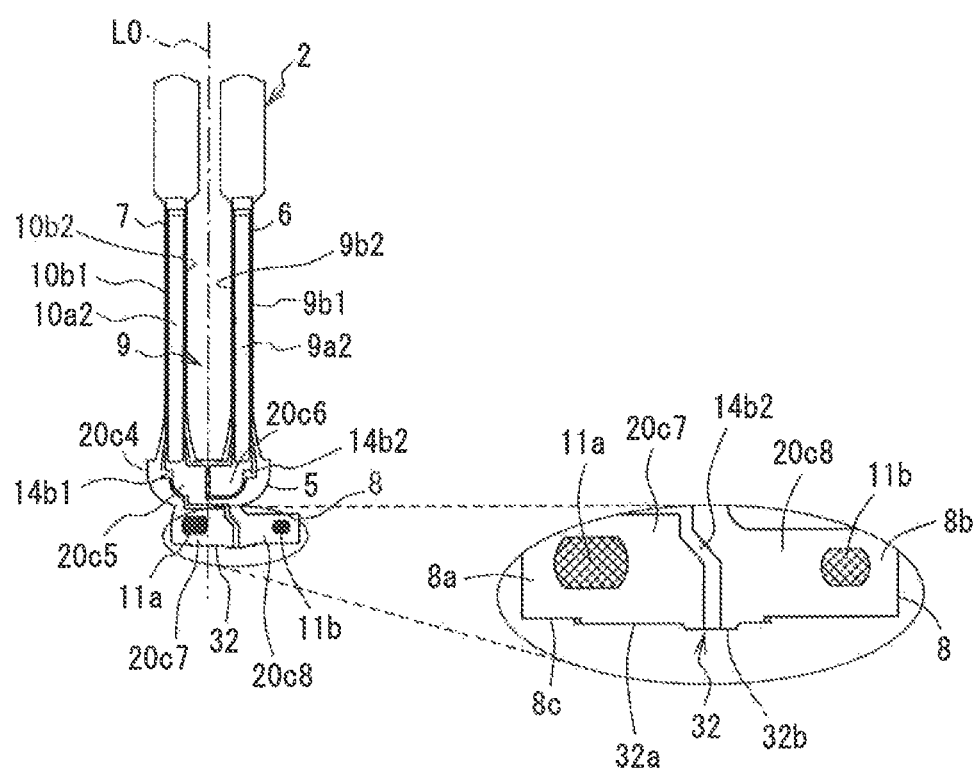
Figure 23:
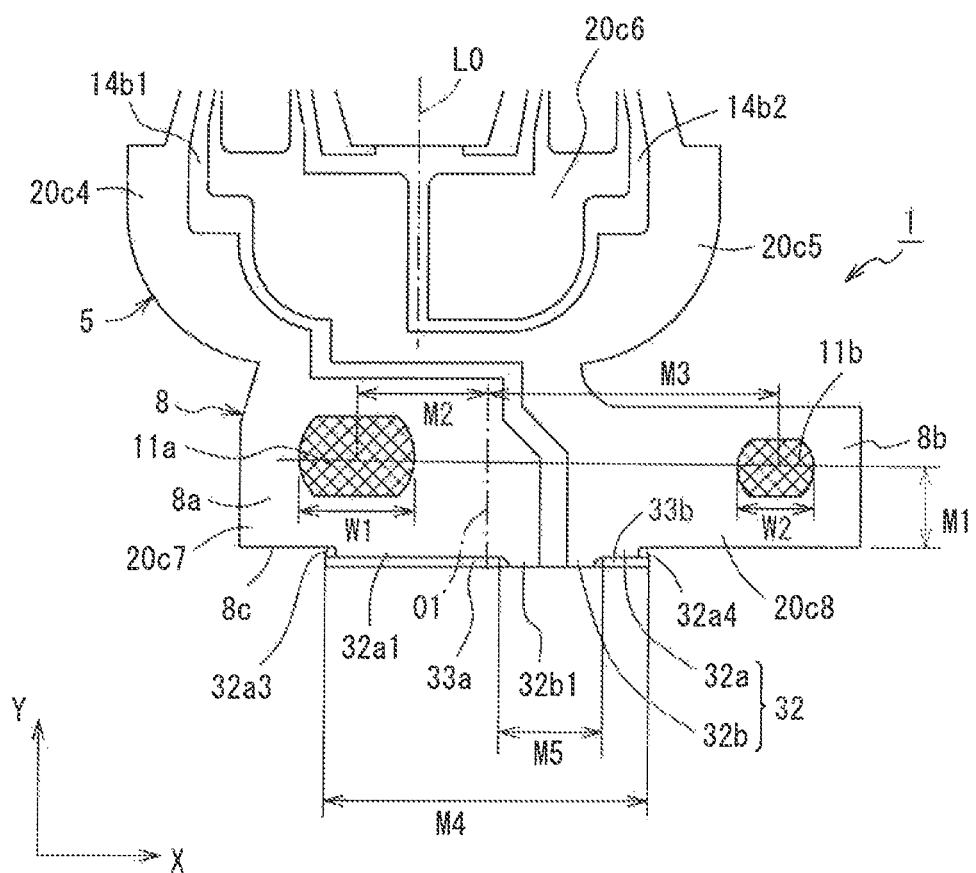
FIG. 23 is an enlarged view of a principal part illustrated in FIG. 22b.
Figure 24:
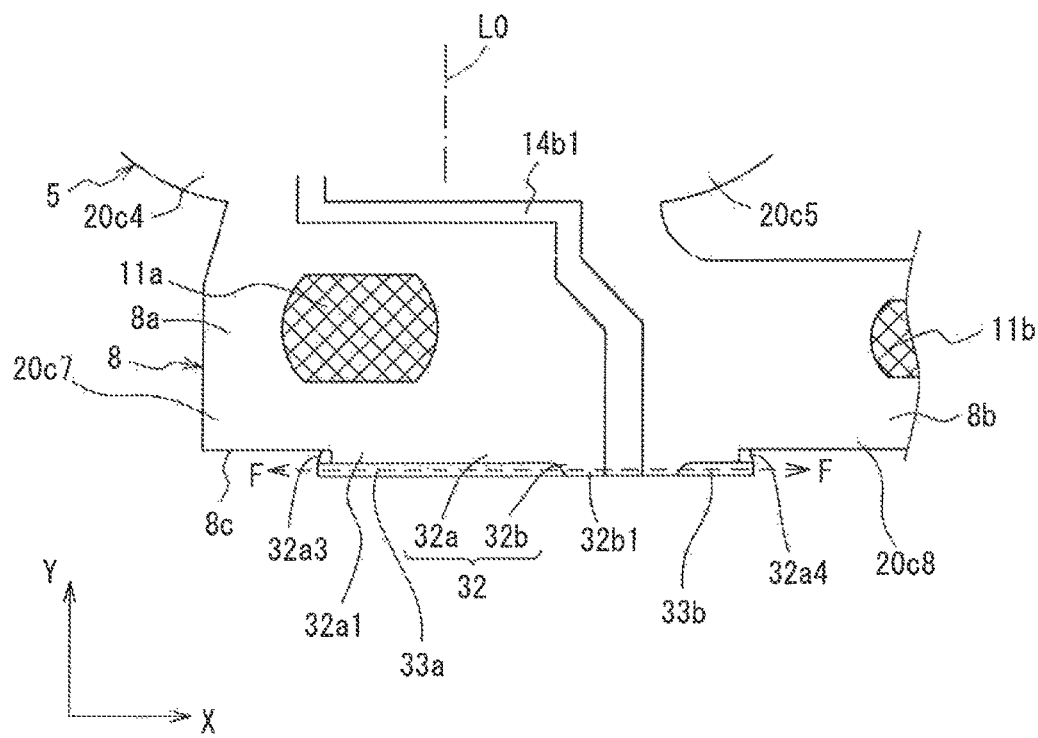
FIG. 24 is a further enlarged view of the principal part illustrated in FIG. 23.
Figure 25:
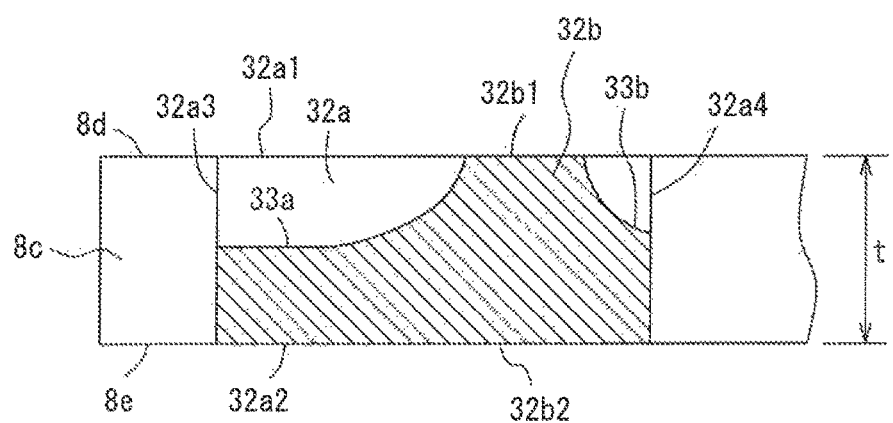
FIG. 25 is an F-F sectional view of the illustration of FIG. 24.

FIG. 22a is a front surface view of the crystal wafer according to the fourth embodiment. FIG. 22b is a back surface view of the crystal vibration piece illustrated in FIG. 22a. FIG. 23 is an enlarged view of a principal part in the crystal vibration piece illustrated in FIG. 22b. FIG. 24 is a further enlarged view of the principal part illustrated in FIG. 23. FIG. 25 is an F-F sectional view of the illustration of FIG. 24. Description of the same structural elements as those described in the earlier embodiments may be partly omitted to avoid redundancy. In these drawings, a reference sign X represents the width direction, and a reference sign Y represents a direction perpendicular to the width direction.

According to the fourth embodiment, the end surface 8c of the junction portion 8 has, in a part thereof in the width direction, a step portion 32 including a first protrusion 32a and a second protrusion 32b formed on the first protrusion 32b, wherein the step portion 32 may further diminish the vibration leakages from the first and second vibration arm portions 6 and 7.

The step portion 32 is a two-step structure including the first protrusion 32a and the second protrusion 32b formed on the first protrusion 32a. With the step portion 32 thus arranged, any vibration leakages from the side surfaces on both sides of the junction portion may be diminished without mutual interference between the vibration leakages.

The first protrusion 32a has a width M4 that starts at the basal end part 8a of the junction portion 8 and continues to the extended part 8b beyond the center line L0 with respect to the end surface 8c on the other side of the junction portion 8. The first protrusion 32a has a top portion 32a1 and a bottom portion 32a2 flat and continuous to a front surface 8d and a back surface 8e of the junction portion 8. The first protrusion 32a is protruding from the end surface 8c within an entire thickness t of the junction portion 8. The top portion 32a1 and the bottom portion 32a2 are equal in size and shape in plan view. The first protrusion 32a has ends 32a3 and 32a4 on both sides in the width direction. The ends 32a3 and 32a4 are, with respect to the end surface 8c, protruding straight obliquely outward toward one side and the other side. On the whole, these ends are protruding substantially perpendicularly a protrusion length of, preferably, approximately 0.01 mm.

The second protrusion 32b has a width M5 smaller than the width M4 of the first protrusion 32a. The second protrusion 32b has a top portion 32b1 and a bottom portion 32b2 flat and continuous to the front surface 8d and the back surface 8e of the junction portion 8. The second protrusion 32b has the same thickness as the thickness t of the junction portion 8 and is protruding from the first protrusion 32a. The second protrusion 32b may preferably be protruding from the first protrusion 32a by a protrusion length of approximately 0.005 mm. On both sides of the top portion 32b1 of the second protrusion 32b are regions formed by etching that are progressively thinner and continuous to the both ends 32a3 and 32a4 of the first protrusion 32a. The progressively thinner regions have surfaces 33a and 33b increased in height by degrees toward the second protrusion 32b. The second protrusion 32b is displaced, from the center of the first protrusion 32a in the width direction, in a direction in which the extended part 8b of the junction portion 8 is extending.

The second protrusion 32b is formed at the center between the first and metal bumps 11a and 11b in the width direction. In a direction perpendicular to the width direction, both ends of the second protrusion 32b in the width direction are distant from the first and metal bumps 11a and 11b with no overlap with the first and metal bumps 11a and 11b. In the crystal vibration piece 2 according to this embodiment, therefore, any cracks present near the end surface of the junction portion 8 may be prevented from further spreading around the first, metal bump 11a, 11b under an external force such as an impact load. This may prevent any vibration frequency drift associated with such an external force imposed on the crystal vibration piece.

In the drawing, a reference sign M1 represents a distance between the end surface 8c of the junction portion 8 and the width center between the first and metal bumps 11a and 11b in the Y direction. The distance M1 may preferably be 0.04 mm to 0.06 mm.

A reference sign M2 represents a distance between a center O1 of the first protrusion 32a in the width direction and the center of the first metal bump 11a in the width direction. The distance M2 may preferably be 0.06 mm to 0.08 mm.

A reference sign M3 represents a distance between the center O1 of the first protrusion 32a in the width direction and the center of the second protrusion 32a in the width direction. The distance M3 may preferably be 0.14 mm to 0.16 mm.

Reference signs W1 and W2 respectively represent widths of the first and second metal bumps 11a and 11b. These widths W1 and W2 may preferably be 0.02 mm to 0.08 mm. A reference sign M4 represents a width of the first protrusion 32a, which may preferably be 0.14 mm to 0.20 mm. A reference sign M5 represents a width of the second protrusion 32b, which may preferably be 0.02 mm to 0.08 mm. The width M5 is a width in the X direction of the bottom section of the second protrusion 32b, which will be described later. The width M5 is smaller than the width M4 of the first protrusion 32a in the X direction. The top portion 32b1 of the second protrusion 32b may have an optional width in the X direction. In relation to stresses to the first and second metal bumps 11a and 11b, the width M5 of the second protrusion 32b may preferably be less than or equal to the widths W1 and W2 of the first and second metal bumps 11a and 11b.

Figure 26:
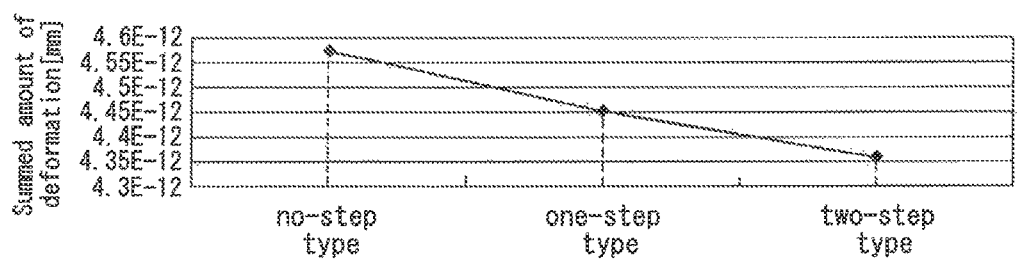

Referring to FIG. 26, a description is given to the effect of diminishing the vibration leakages achievable by the step portion 32 of the crystal vibration piece 2 structured as described so far.

The vibration leakage diminishing effect is described by way of comparison among a crystal vibration piece according to a first comparative example in which the end surface 8c of the junction portion 8 is flat with no protrusion (hereinafter, "no-step" type), a crystal vibration piece according to a second comparative example in which the end surface 8c of the junction portion 8 has a single protrusion (hereinafter, "one-step" type), and the crystal vibration piece 2 according to this embodiment in which the end surface 8c of the junction portion 8 has two protrusions (hereinafter, "two-step" type).

Referring to FIG. 26, the "no-step" type shown on the lateral axis refers to the crystal vibration piece according to the first comparative example, the "one-step" type shown on the lateral axis refers to the crystal vibration piece according to the second comparative example, and the "two-step" type shown on the lateral axis refers to the crystal vibration piece 2 according to this embodiment. The longitudinal axis shows a summed amount of deformation of each crystal vibration piece (mm), which is the indication of a degree of vibration leakages.

A vibration leakage simulation was carried out for each of these crystal vibration pieces. The simulation result exhibited a degree of vibration leakages of approximately 4.36E-12 in the crystal vibration piece 2 according to this embodiment in contrast to approximately 4.56E-12 in the crystal vibration piece according to the first comparative example and approximately 4.45E-12 in the crystal vibration piece according to the second comparative example.

This demonstrates that the vibration leakages in the crystal vibration piece according to this embodiment were diminished as compared to the crystal vibration pieces according to the first and second comparative examples.

The crystal vibration piece of "two-step" type according to this embodiment has, on the end surface of the junction portion 8, the step portion 22 including the first and second protrusions 32a and 32b. This crystal vibration piece may more effectively diminish the vibration leakages from the first and second vibration arm portions 6 and 7 than the conventional crystal vibration pieces of "no-step" type and "one-step" type.

In the crystal vibration piece according to this embodiment, the second protrusion 32b is formed at a position displaced from the first protrusion 32a. Since a position at which the second protrusion 32b is formed on the first protrusion 32a may affect the vibration leakage diminishing effect, the position of the second protrusion 32b is not necessarily limited as described in the embodiment but may be optionally decided through experiments.

Production of Crystal Vibration Piece

Figure 27:
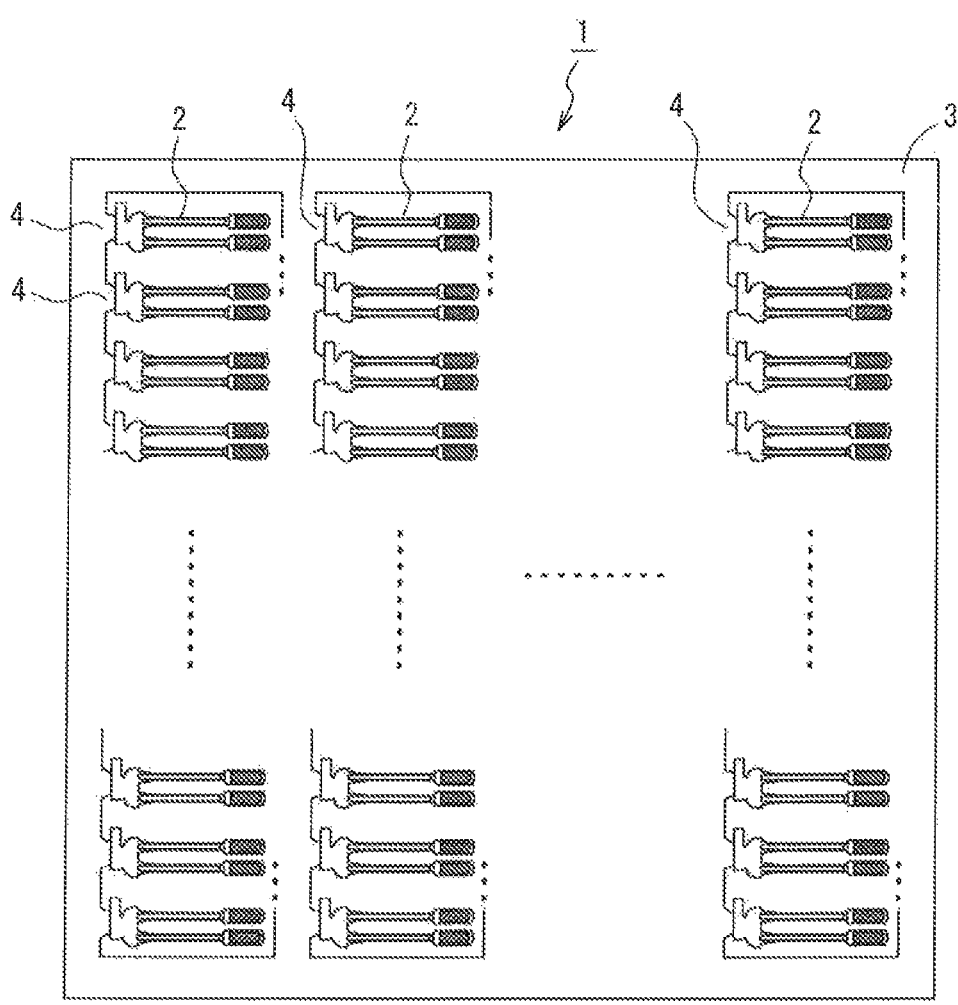
Figure 28A:
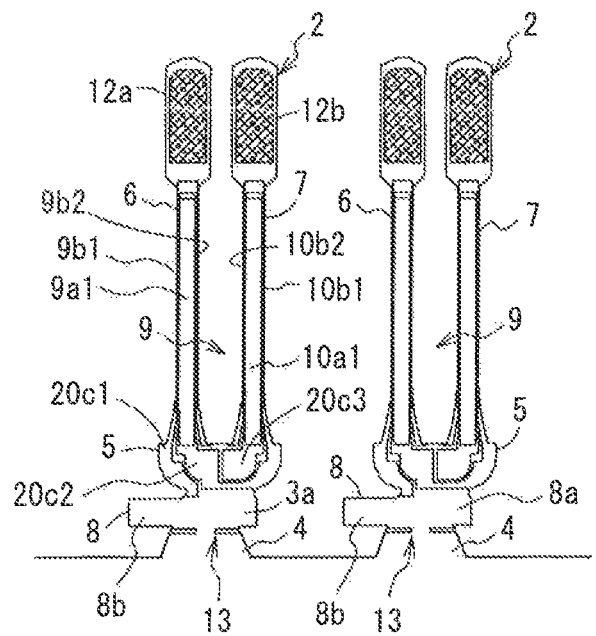
FIG. 28a is a partly enlarged front surface view of the crystal wafer illustrated in FIG. 27.
Figure 28B:
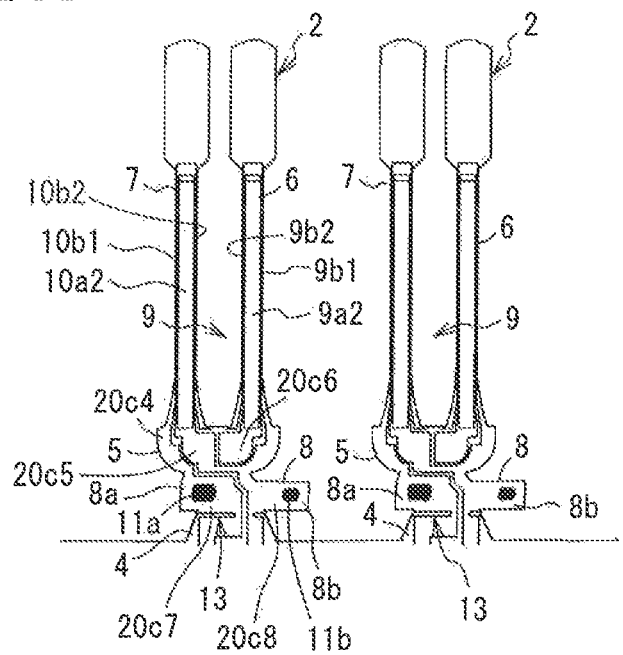
FIG. 28b is a partly enlarged back surface view of the crystal wafer illustrated in FIG. 27.
Figure 29:
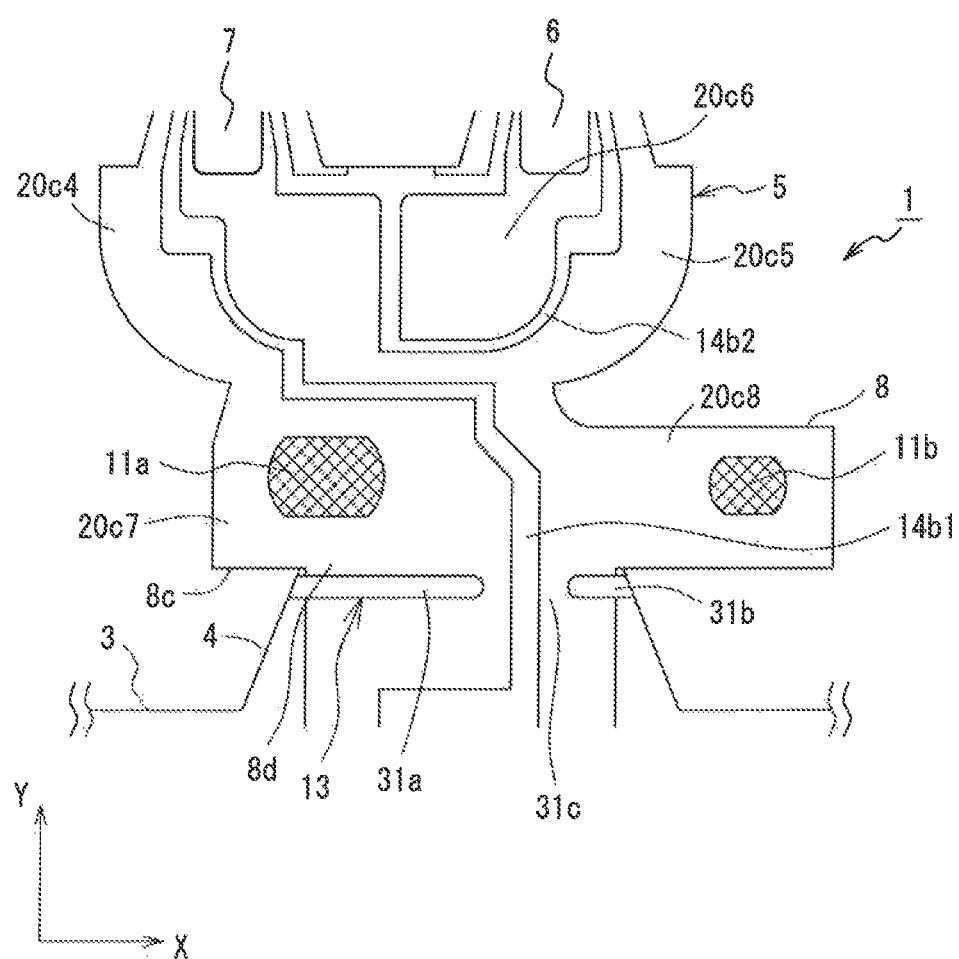
FIG. 29 is an enlarged view of a principal part illustrated in FIG. 28b.

An exemplified production of the crystal vibration piece 2 according to this embodiment is described referring to FIGS. 27 to 29. FIG. 27 is an overall plan view of a crystal wafer for use in fabricating crystal vibration pieces according to this embodiment. FIG. 28a is a partly enlarged front surface view of the crystal wafer illustrated in FIG. 27. FIG. 28b is a partly enlarged back surface view of the crystal wafer illustrated in FIG. 27. FIG. 29 is an enlarged view of a principal part illustrated in FIG. 28b. In these drawings, any structural elements corresponding to those of FIGS. 22a to 25 are illustrated with the same reference signs.

Referring to these drawings, a crystal wafer 1 is essentially configured similarly to the crystal wafer according to the first embodiment, wherein a protrusion 3d corresponding to the first protrusion 32a is formed on the end surface 8c of the coupling portion 4. The break-off part 13 has grooved slits 31a and 31b extending along the protrusion 8d in the width direction of the coupling portion 4. These grooved slits 31a and 31b are not penetrating through the front and back surfaces of the coupling portion 4. No slit is formed in a part in the width direction between these slits 31a and 31b. This part in the width direction constitutes a bridge 31c having both surfaces continuous to the front and back surfaces of the crystal wafer 1. The bride 31*c* serves to couple the crystal vibration piece 2 to the coupling portion 4.

When the crystal vibration piece 2 supported on the frame portion 3 in this crystal wafer 1 is broken off at the break-off part 13 formed in the coupling portion 4, the step portion 32 is formed at the break-off end part on the end surface 8*c* of the junction portion 8 of the crystal vibration piece 2. The step portion 32 includes the first protrusion 32*a* corresponding to the protrusion 8*d* formed on the end surface 8*c* of the junction portion 8 and the second protrusion 32*b* corresponding to the bridge 13*c*.

When the crystal vibration piece 2 is broken off and separated from the crystal wafer 1, cracks possibly originating from the bridge 13*c* may spread to the break-off end part of the bridge 13*c* at which the crystal vibration piece 2 is broken off. In case the crystal vibration piece 2 with cracks at the break-offend part is exposed to an external force such as an impact load, the cracks may further spread around the first, second metal bump 11*a*, 11*b*. Such an outspread of the cracks may result in frequency drift in the crystal vibration piece 2, involving the risk of degrading the vibration characteristics of the crystal vibration piece 2.

To avoid that, the crystal wafer 1 has the bridge 13*c* formed at the center in the width direction between the first and second metal bumps 11*a* and 11*b*. Then, both ends of the bridge 13*c* in the width direction may be distantly spaced from the first and second metal bumps 11*a* and 11*b* in the direction perpendicular to the width direction with no overlap with the first and second metal bumps 11*a* and 11*b*.

In case any cracks are generated at the break-off end part in the crystal vibration piece 2 broken off and separated from the frame portion 3 of the crystal wafer 1, the cracks may be prevented from further spreading around the metal bump, 11*a*, 11*b*, under an external force such as an impact load. This may effectively suppress any frequency drift associated with the cracks.

As described thus far, the fourth embodiment provides, on the end surface of the junction portion 8 on the other end side of the crystal vibration piece 2, the step portion 32 including the first protrusion 32*a* and the second protrusion 32*b* formed thereon in a smaller width than the first protrusion 32*a*. This structural advantage may effectively diminish the vibration leakages from the side surfaces to the end surface 8*c* of the junction portion 8.

The fourth embodiment is characterized in that the step portion is formed on the end surface 8*c* of the junction portion 8. However, the step portion 22 may be formed on the other end surface of the base portion 5 in any crystal vibration piece with no junction portion 8 wherein the first and second metal bumps 11*a* and 11*b* are formed on the extraction electrodes 20*c*4 and 20*c*6 of the base portion 5 in the direction in which the first and second vibration arm portions 6 and 7 are juxtaposed.

It should be understood that the invention is not limited to the embodiments described thus far. The invention may be carried out in many other forms without departing from its technical concept or principal technical features. The embodiments described so far are just a few examples of the invention in all aspects, which should not be construed to restrict the scope of the invention. The scope of this invention is solely defined by the appended claims, and should not be restricted by the text of this description. Any modifications or changes made within the scope of the appended claims are all included in the scope of this invention.

The invention claimed is:

1. A piezoelectric wafer, comprising:
a piezoelectric vibration piece;
a frame portion that supports the piezoelectric vibration piece; and
a coupling portion that couples the piezoelectric vibration piece to the frame portion, wherein
the piezoelectric vibration piece has a pair of first and second metal bumps juxtaposed at an interval in a width direction of the coupling portion, the piezoelectric vibration piece being separable from the frame portion by being broken off from the frame portion at the coupling portion,
the coupling portion has a break-off slit formed along the width direction of the coupling portion except for a part of the coupling portion in the width direction, and
ends in the width direction of the part of the coupling portion in the width direction are spaced from the first and second metal bumps with no overlap with the first and second metal bumps in a direction perpendicular to the width direction of the coupling portion.

2. The piezoelectric wafer as claimed in claim 1, wherein a section largest in width of the part of the coupling portion in the width direction is not overlapping with the first and second metal bumps in the direction perpendicular to the width direction.

3. The piezoelectric wafer as claimed in claim 1, wherein the part of the coupling portion in the width direction is formed at a central position between the first and second metal bumps juxtaposed.

4. The piezoelectric wafer as claimed in claim 1, further comprising:
at least a pair of vibration arm portions;
a junction portion joined to an external element; and
a base portion having one end surface and another end surface opposite to the one end surface, the pair of vibration arm portions being juxtaposed on the one end surface of the base portion, and the junction portion being formed on the another end surface of the base portion, wherein
the pair of vibration arm portions is protruding in parallel to each other from the one end surface of the base portion, and
the junction portion comprises:
a basal end part formed at a middle position on the another end surface of the base portion in a direction in which the pair of vibration arm portions is juxtaposed, the basal end part having the first metal bump formed thereon; and
an extended part extending from the basal end part toward one side in the width direction of the coupling portion, the extended part having the second metal bump formed thereon, the junction portion comprising the basal end part and the extended part having an L-like shape in plan view, and
the first metal bump is greater in size in plan view than the second metal bump.

5. The piezoelectric vibration piece broken off and separated from the frame portion of the piezoelectric wafer as claimed in claim 1, further comprising:
a vibrating unit disposed on at least one end side thereof;
a junction portion for external use formed on another end side opposite to the one end side, wherein
the junction portion has the first and second metal bumps juxtaposed in the width direction on the another end side, a break-off end part broken off from the frame portion on an end surface on the another end side, and an end of the break-off end in the width direction is distantly spaced from the first and second metal bumps with no overlap with the first and second metal bumps in the direction perpendicular to the width direction of the coupling portion.

6. The piezoelectric vibration piece as claimed in claim 5, wherein the vibrating unit is a pair of vibration arm portions in the form of a tuning fork each having driving electrodes formed on a front surface, a back surface, side surfaces on both sides thereof.

7. A piezoelectric vibration piece produced by breaking off and separating the piezoelectric vibration piece from the frame portion of the piezoelectric wafer of claim 4, wherein:

a plurality of driving electrodes are formed on a front main surface, a back main surface, and side surfaces on both sides in each of the pair of vibration arm portions, base portion extraction electrodes are formed on the base portion, the base portion extraction electrodes including a base portion extraction electrode for connection by which the plurality of the driving electrodes are partly common-connected, and a pair of base portion extraction electrodes for external use by which the plurality of the driving electrodes are partly externally extracted, and the base portion extraction electrodes are greater in thickness than the driving electrodes formed on the front and back main surfaces of the vibration arm portions.

8. The piezoelectric vibration piece as claimed in claim 7, wherein edge-of-arm extraction electrodes by which the plurality of the driving electrodes are partly common-connected are formed on edge sides of the vibration arm portions, the edge-of-arm extraction electrodes are greater in thickness than the driving electrodes, and the base portion extraction electrodes are at least substantially equal in thickness to the edge-of-arm extraction electrodes.

9. The piezoelectric vibration piece as claimed in claim 7, further comprising a junction portion protruding from the another end surface of the base portion, wherein the junction portion comprises:

a basal end part protruding from a position on the another end surface of the base portion across a central line between positions at which the pair of vibration arm portions are juxtaposed;

an extended part extending from the basal end part toward one side in the direction in which the pair of vibration arm portions are juxtaposed, the junction portion comprising the basal end part and the extended part has an L-like shape in plan view, a first junction extraction electrode for external use to which one of the pair of base portion extraction electrodes for external use is extracted is formed on a surface of the basal end part, and a first metal bump is formed on the first junction extraction electrode for external use, a second junction extraction electrode for external use to which the other one of the pair of base portion extraction electrodes for external use is extracted is formed on a surface of the extended part, and a second metal bump is formed on the second junction extraction electrode for external use, and the first metal bump is greater in size in plan view than the second metal bump.

10. The piezoelectric vibration piece as claimed in claim 7, wherein the edge-of-arm extraction electrodes have surface layers plated with a metal, metal bumps are formed on the base portion extraction electrodes for external use or on the junction extraction electrodes for external use, and the metal bumps have surface layers plated with the same metal as the plating metal of the edge-of-arm extraction electrodes.

11. The piezoelectric vibration piece as claimed in claim 7, wherein the base portion has both side parts symmetrically and equally shaped in plan view relative to a central line between positions at which the pair of vibration arm portions are juxtaposed, and the base portion extraction electrodes are electrically insulated from each other and formed in an equal thickness on substantially the whole front and back surfaces of the base portion.

12. A piezoelectric vibration piece produced by breaking off and separating the piezoelectric vibration piece from the frame portion of the piezoelectric wafer of claim 1, and the piezoelectric vibration piece further comprising a pair of vibration arm portions juxtaposed on one end side thereof and protruding in parallel to each other from the one end side, wherein a step portion including a first protrusion and a second protrusion formed on the first protrusion is formed in a part of an end surface on another end side opposite to the one end side.

13. The piezoelectric vibration piece as claimed in claim 12, further comprising:

a base portion having the pair of vibration arm portions formed on one end surface thereof; and a junction portion formed on another end surface of the base portion opposite to the one end surface, wherein the junction portion comprises:

a basal end part having a first metal bump and protruding from a region on the another end surface of the base portion across a central line between positions at which the pair of vibration arm portions are juxtaposed; and an extended part having a second metal bump and protruding from the base portion toward one side in a direction in which the pair of vibration arm portions are juxtaposed, the junction portion comprising the basal end part and the extended part has an L-like shape in plan view, and an end surface of the junction portion is located on the another end side, and the step portion is formed on the end surface of the junction portion.

14. The piezoelectric vibration piece as claimed in claim 12, wherein the first protrusion is formed in a width across a center line between positions at which the vibration arm portions are juxtaposed.

15. The piezoelectric vibration piece as claimed in claim 12, wherein side surfaces of the first protrusion on both ends in a width direction thereof are rising substantially perpendicularly from the end surface on the another end side thereof, and front and back surfaces of the first protrusion are flat and continuous to front and back surfaces on the another end side thereof, the second protrusion is smaller in width than the first protrusion, and the second protrusion has, on both sides in a width direction thereof, regions progressively thinner toward the both ends of the first protrusion in the width direction.

16. The piezoelectric vibration piece as claimed in claim 12, wherein
both ends of the second protrusion in the width direction are remotely spaced from the first and second metal bumps with no overlap with the first and second metal bumps in the direction perpendicular to the width direction.

17. The piezoelectric vibration piece as claimed in claim 12, wherein
the second protrusion is formed at a position displaced from a central position between positions at which the pair of vibration arm portions are juxtaposed toward one side in a direction in which the pair of vibration arm portions are juxtaposed.

18. The piezoelectric vibration piece as claimed in claim 12, wherein
the second protrusion has a top portion and a bottom portion each becoming a flat surface continuous to the front and back surfaces of the junction portion.

19. A piezoelectric vibrator comprising the piezoelectric vibration piece as claimed in claim 5 supported in a package.

20. A piezoelectric vibrator comprising the piezoelectric vibration piece as claimed in claim 7 supported in a package.

21. A piezoelectric vibrator comprising the piezoelectric vibration piece as claimed in claim 12 supported in a package.

22. A method of producing a piezoelectric vibration piece, comprising:
producing the piezoelectric wafer of claim 1, and
breaking off and separating the piezoelectric vibration piece from the frame portion of the piezoelectric wafer.

* * * * *